United States Patent [19]

Yu

[11] 3,942,160

[45] Mar. 2, 1976

[54] BIT SENSE LINE SPEED-UP CIRCUIT FOR MOS RAM

[75] Inventor: Robert Tapei Yu, Tempe, Ariz.

[73] Assignee: Motorola, Inc., Chicago, Ill.

[22] Filed: June 3, 1974

[21] Appl. No.: 475,560

[52] U.S. Cl............................ 340/173 R; 340/172.5
[51] Int. Cl.².......................................... G11C 13/00
[58] Field of Search....... 340/172.5, 173 R, 173 FF, 340/173 SP

[56] References Cited
UNITED STATES PATENTS

| | | | |
|---|---|---|---|
| 3,693,170 | 9/1972 | Ellis | 340/173 R |
| 3,786,437 | 1/1974 | Croxon | 340/173 R |

*Primary Examiner*—Terrell W. Fears
*Attorney, Agent, or Firm*—Harry M. Weiss; Charles R. Hoffman

[57] ABSTRACT

A speed-up circuit for a bit sense line of an MOS RAM includes a cross-coupled latch circuit having an output coupled to the bit sense line. When partial discharging of the bit sense line is accomplished through the selected storage cell, the latch circuit switches states and completes discharge of the bit sense line much more rapidly than could have been achieved by the action of the selected storage cell alone. A disabling circuit is connected to the gate of a pull-down MOSFET of the latch circuit connected to the output thereof to turn off the pull-down MOSFET during a write cycle or during the write portion of a read-modify-write cycle. The output of the disabling, or turn-off, circuit operates in response to a signal derived from a clock signal and a chip enable signal applied to the MOS RAM. A bootstrap circuit is provided including a bootstrap charging MOSFET having its gate coupled to $V_{DD}$, its source coupled to the bootstrap capacitor, and its drain coupled to a clock signal conductor, to provide low-power dissipation and fast rise time.

7 Claims, 18 Drawing Figures

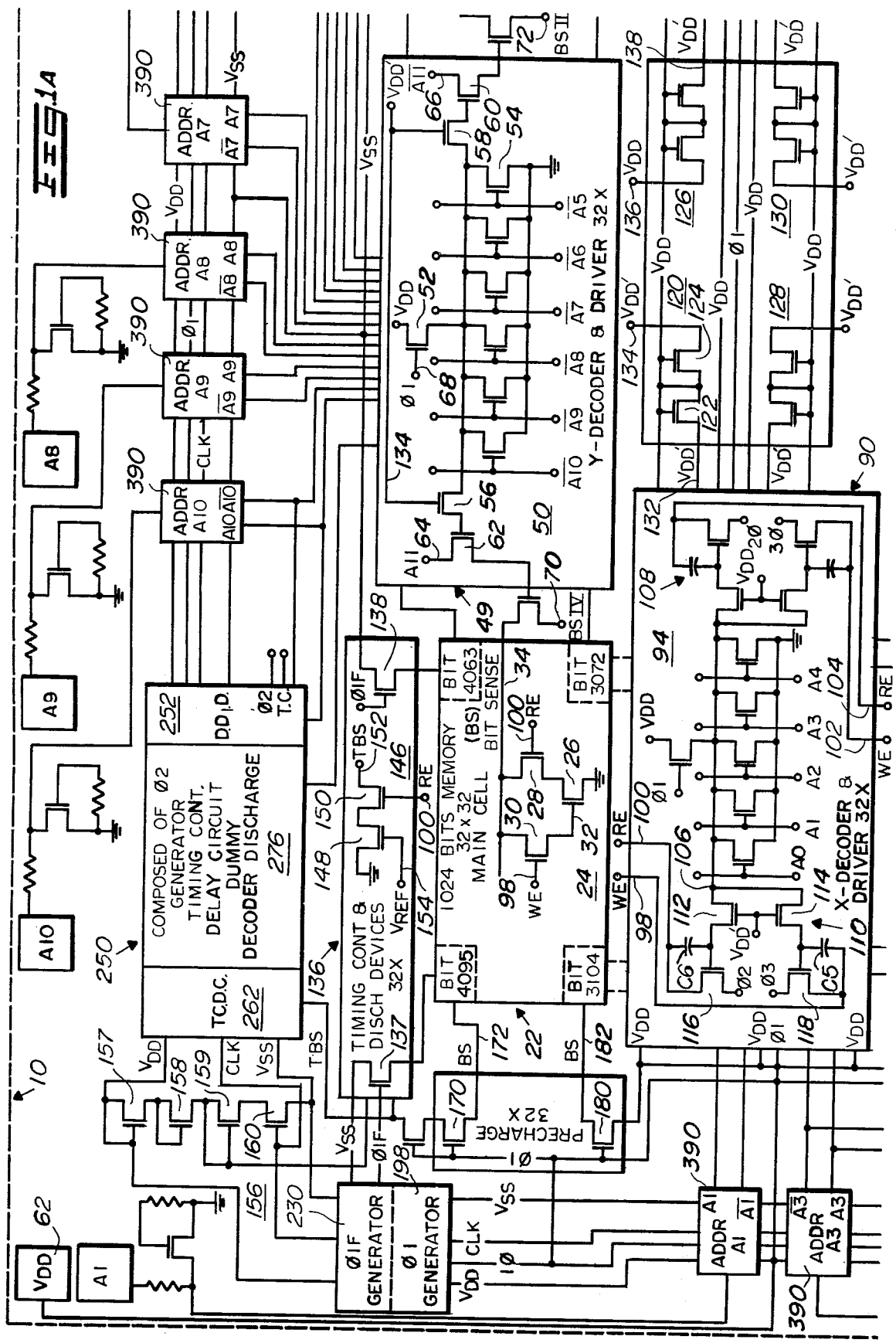

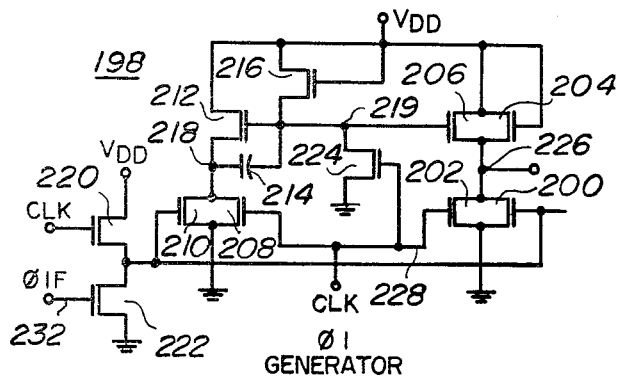
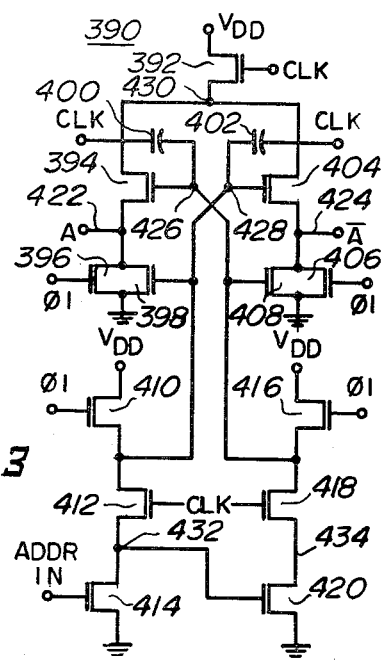
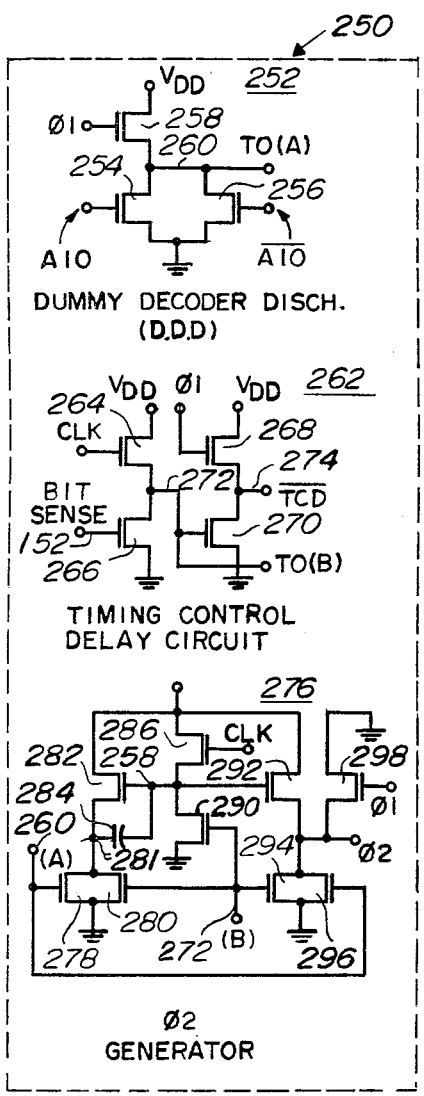
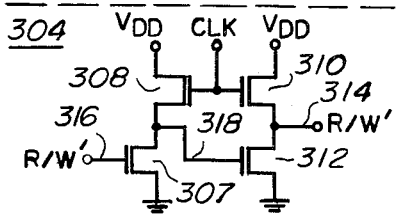
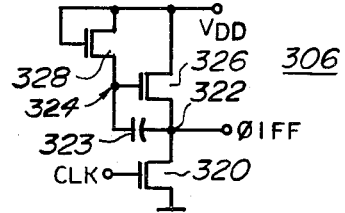
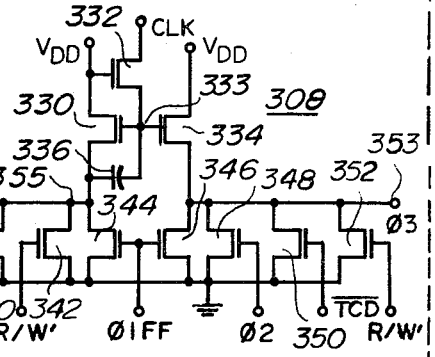

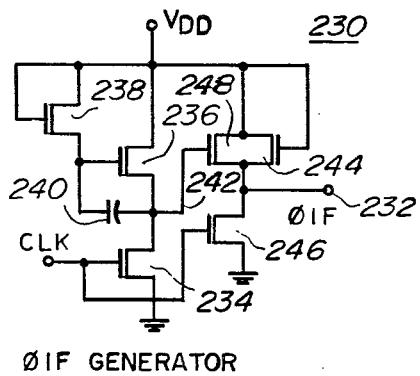
ØIF GENERATOR
FIG.7
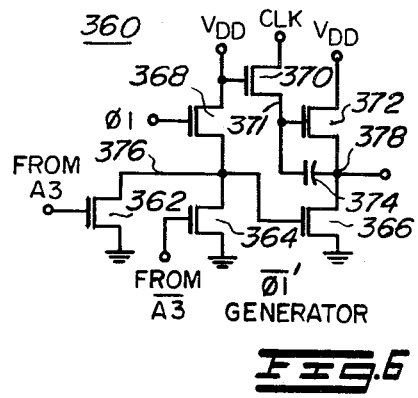
FIG.6
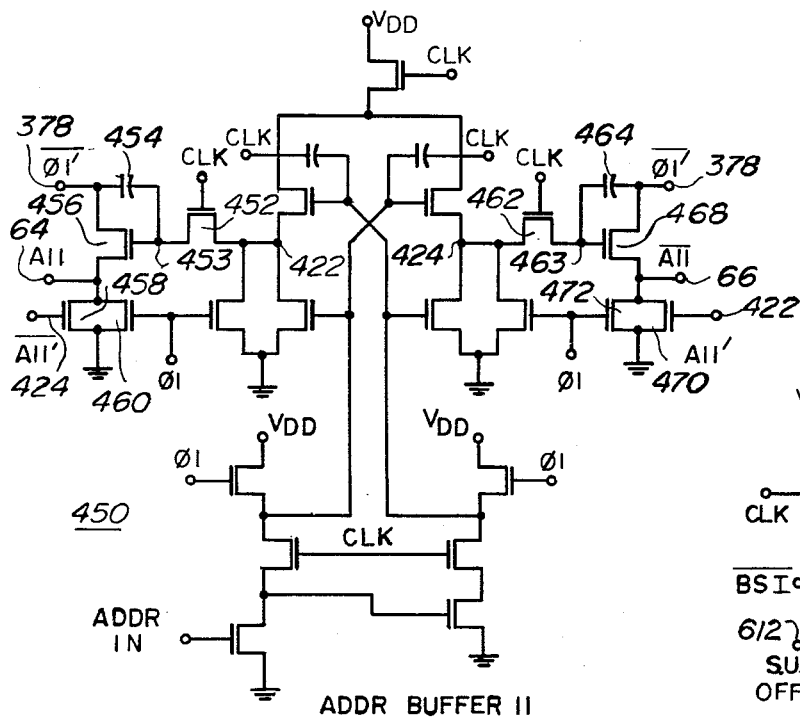
ADDR BUFFER II
FIG.8
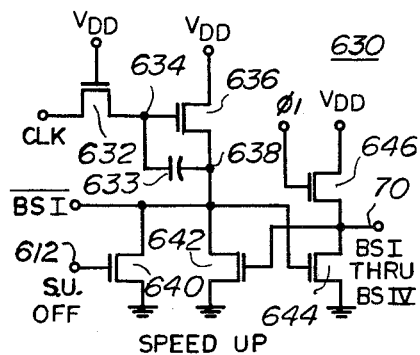
SPEED UP
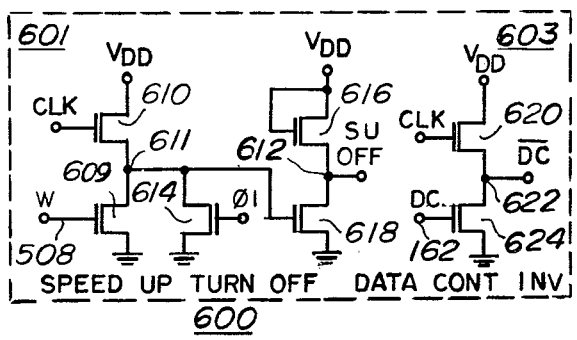
SPEED UP TURN OFF    DATA CONT INV
FIG.10

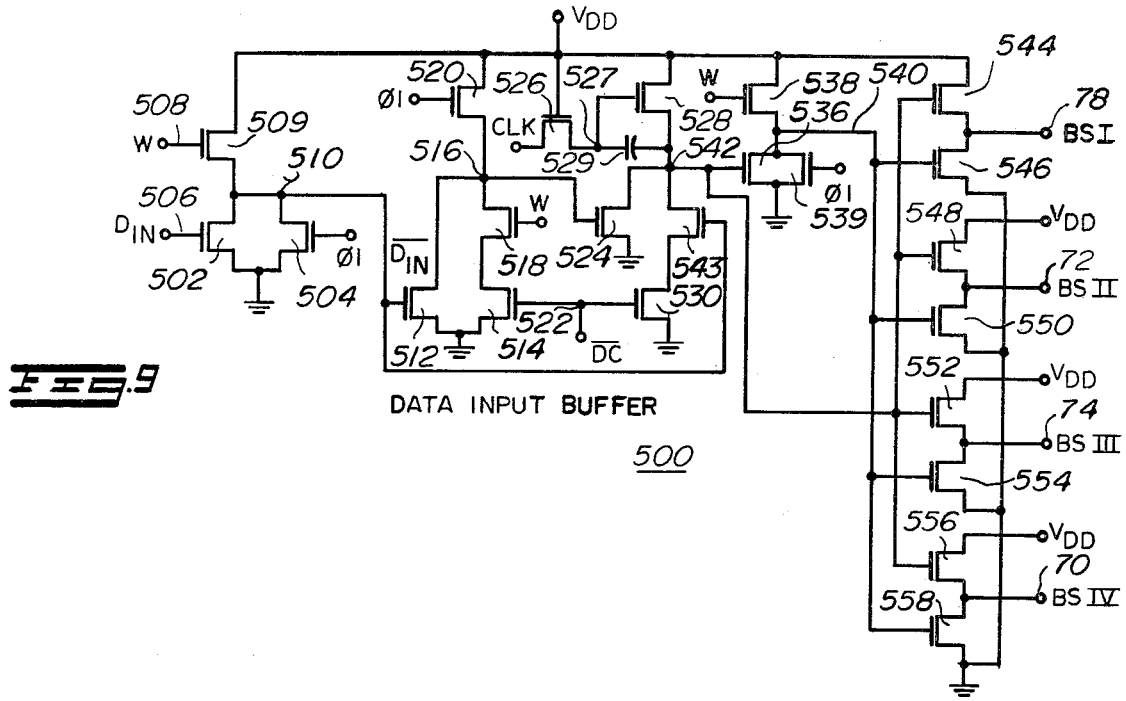
Fig. 9 DATA INPUT BUFFER 500
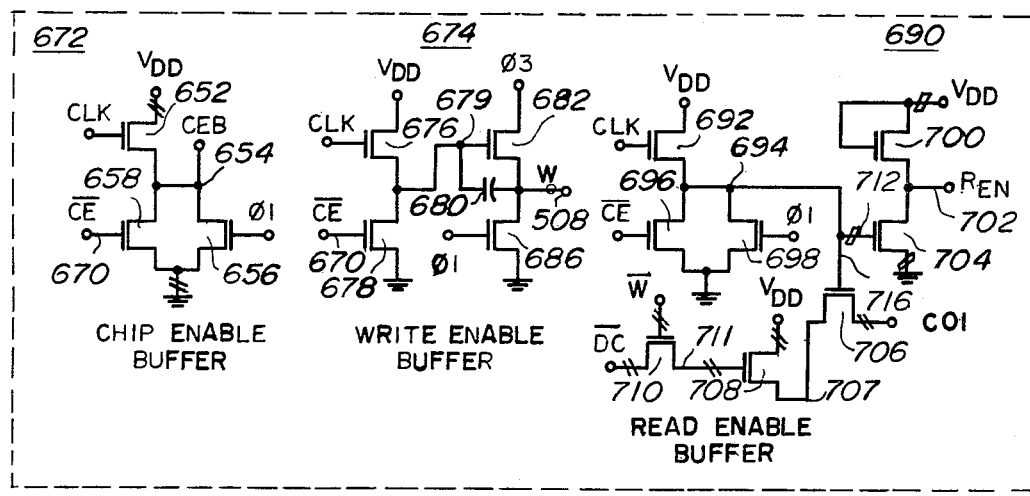
Fig. 12
650
672 CHIP ENABLE BUFFER
674 WRITE ENABLE BUFFER
690 READ ENABLE BUFFER

BIT SENSE LINE SPEED-UP CIRCUIT FOR MOS RAM

BACKGROUND OF THE INVENTION

MOS dynamic random access memories (RAMS) have provided the lowest cost semiconductor memory storage yet achievable. Recent research in the area of MOS dynamic RAMS has led to steadily increasing bit density and faster access times. However, as the density of storage cells of an MOS array has in-increased, the size of the individual cells has become progressively smaller and the current discharging capability of the individual storage cells with respect to discharging the bit sense line capacitance is decreased. Efforts have been made to increase the access times of dynamic MOS memories by providing circuits which sense small voltage changes of the bit sense line. Another approach has been to couple the bit sense line to a circuit which senses the initial discharge of the bit sense line by a storage cell and cuts in to rapidly complete the discharge thereof. Dynamic latch circuits have been used to accomplish this purpose. However, such dynamic latch circuits have had the disadvantage that they provide a rather low impedance connected to the bit sense line during a write cycle and do not permit a read-modifywrite cycle. This is because the output of the dynamic latch is disabled or set to a high impedance state by a clock signal used for precharging various nodes of the memory prior to the read clock signal. During the read or refresh portion of a memory cycle, however, the state of the speed-up latch may be switched, resulting in a low output impedance during a following write operation. Conventional bootstrap circuit, which could be used on the latch circuit, dissipate a substantial amount of power.

SUMMARY OF THE INVENTION

It is an object of the invention to provide an improved circuit for speeding up the discharge of a bit sense line of a random access memory.

It is another object of the invention to provide an improved speed-up circuit to air the discharge of a bit sense line of an MOS RAM which does not interfere with a write cycle or a read-modify-write cycle.

Briefly described, the invention provides a latch type speed-up circuit having an output coupled to a bit sense line of a dynamic MOS RAM. The output MOSFET of the latch has its gate coupled to the drain of a MOSFET which has its source coupled to ground and its gate controlled by a signal derived from a chip select input applied to the MOS RAM and from a write phase clock signal applied to or generated within the RAM. A novel clocked bootstrap circuit including a bootstrap capacitor charging MOSFET having its drain coupled to a clock signal and its gate connected to $F_{DD}$ is provided as a load circuit for the output side of the latch circuit, and provides reduced power dissipation and fast rise times for the quadrant bit sense lines.

BRIEF DESCRIPTION OF THE DRAWINGS

FIGS. 1a – 1d are schematic drawings of four sections, respectively, of an MOS random access memory chip. FIG. 1a represents the upper left-hand section of the chip, FIG. 1b represents the upper right-hand section, FIG. 1c represents the lower left-hand section and FIG. 1d represents the lower right-hand section.

FIG. 2 is a schematic diagram of $\phi 1$ clock signal generator according to an embodiment of the invention.

FIG. 3 is a shematic diagram of an address input buffer according to an embodiment of the invention.

FIG. 4 is a schematic diagram of a $\phi 2$ generator, a dummy decoder circuit, and a timing control delay circuit used in the embodiment of FIGS. 1a – 1d.

FIG. 5 is a schematic diagram of the $\phi 3$ clock signal generator, the $\phi 1_{FF}$ clock signal generator and the R/W signal circuits indicated in the partial schematic drawings of FIGS. 1a – 1d.

FIG. 6 is a schematic diagram of the $\phi 1'$ generator of FIGS. 1a – 1d.

FIG. 7 is a schematic diagram of the $\phi 1_F$ generator of FIGS. 1a – 1d.

FIG. 8 is a schematic diagram of the address buffer 11 circuit of FIGS. 1a – 1d.

FIG. 9 is a schematic diagram of the data input buffer circuit utilizable in the memory of FIGS. 1a – 1d.

FIG. 10 is a schematic diagram of a speed-up turnoff circuit and the data control inverter circuit used in the memory of FIGS. 1a – 1d.

FIG. 11 is a schematic diagram of a speed-up circuit utilized in the memory of FIGS. 1a – 1d.

FIG. 12 is a schematic diagram of the chip enable buffer, the write enable buffer, and the read enable buffer circuits utilized in the memory of FIGS. 1a – 1d.

DESCRIPTION OF THE INVENTION

The material in this patent application is related to U.S. Pat. No. 3,796,893, by Charles R. Hoffman and Donald H. Kube entitled "Peripheral Circuitry for Dynamic MOS RAM's" and assigned to the assignee of the present invention.

This application is also related to the following patent applications, filed on even date herewith and assigned to the present assignee: "MOS Memory System," by Robert T. Yu (SC-73785); "Bit Sense Line Speed-up Circuit for MOS RAM," by Robert T. Yu (SC-74751); "External Data Control Preset System for Inverting Cell MOS Ramdom Access Memory," by William W. Lattin (SC-74752); and "External Exclusive OR Type Circuit for Inverting Cell MOS RAM," by Bernard D. Broeker (SC-74753).

Figure 1B:
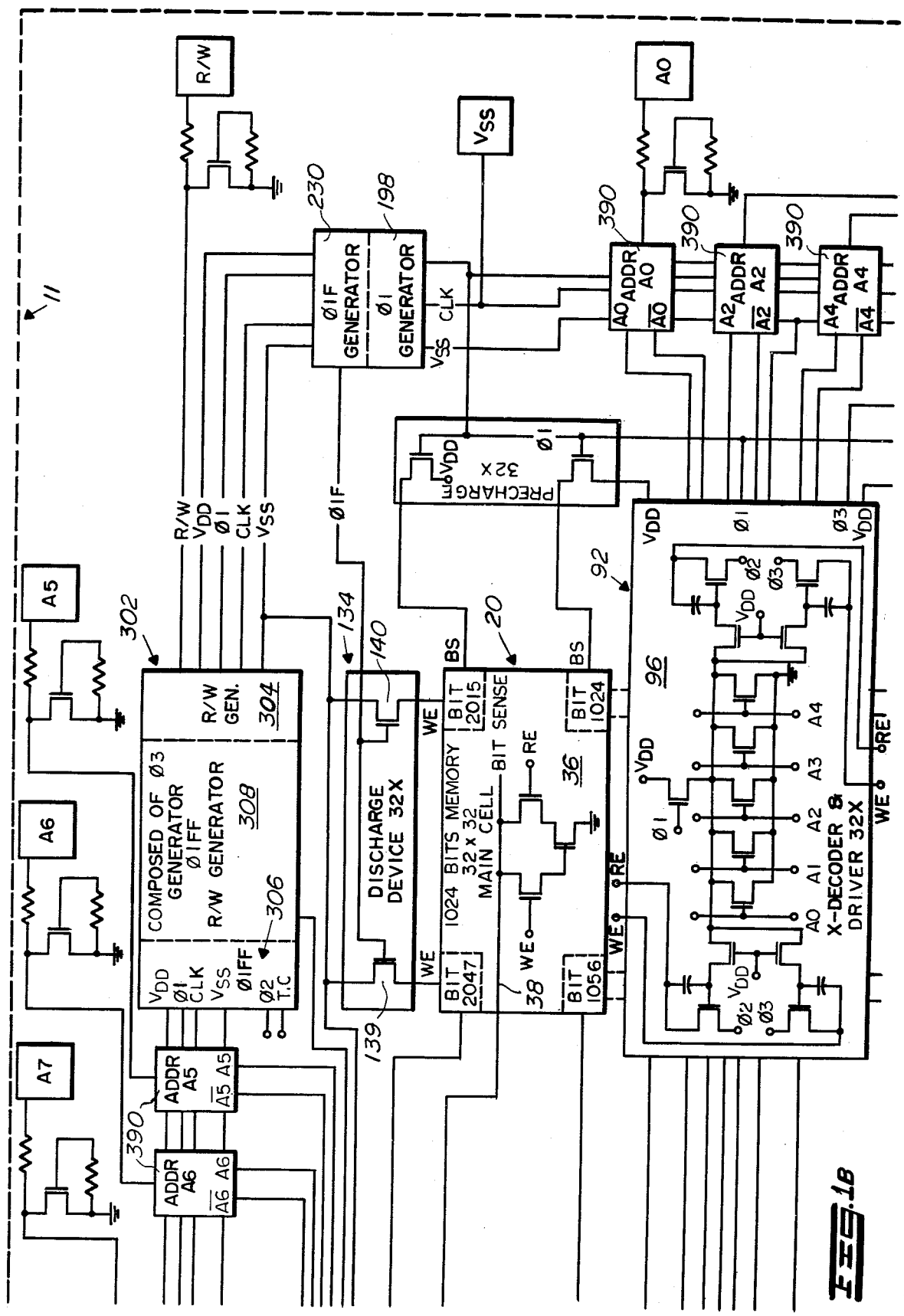
Figure 1C:
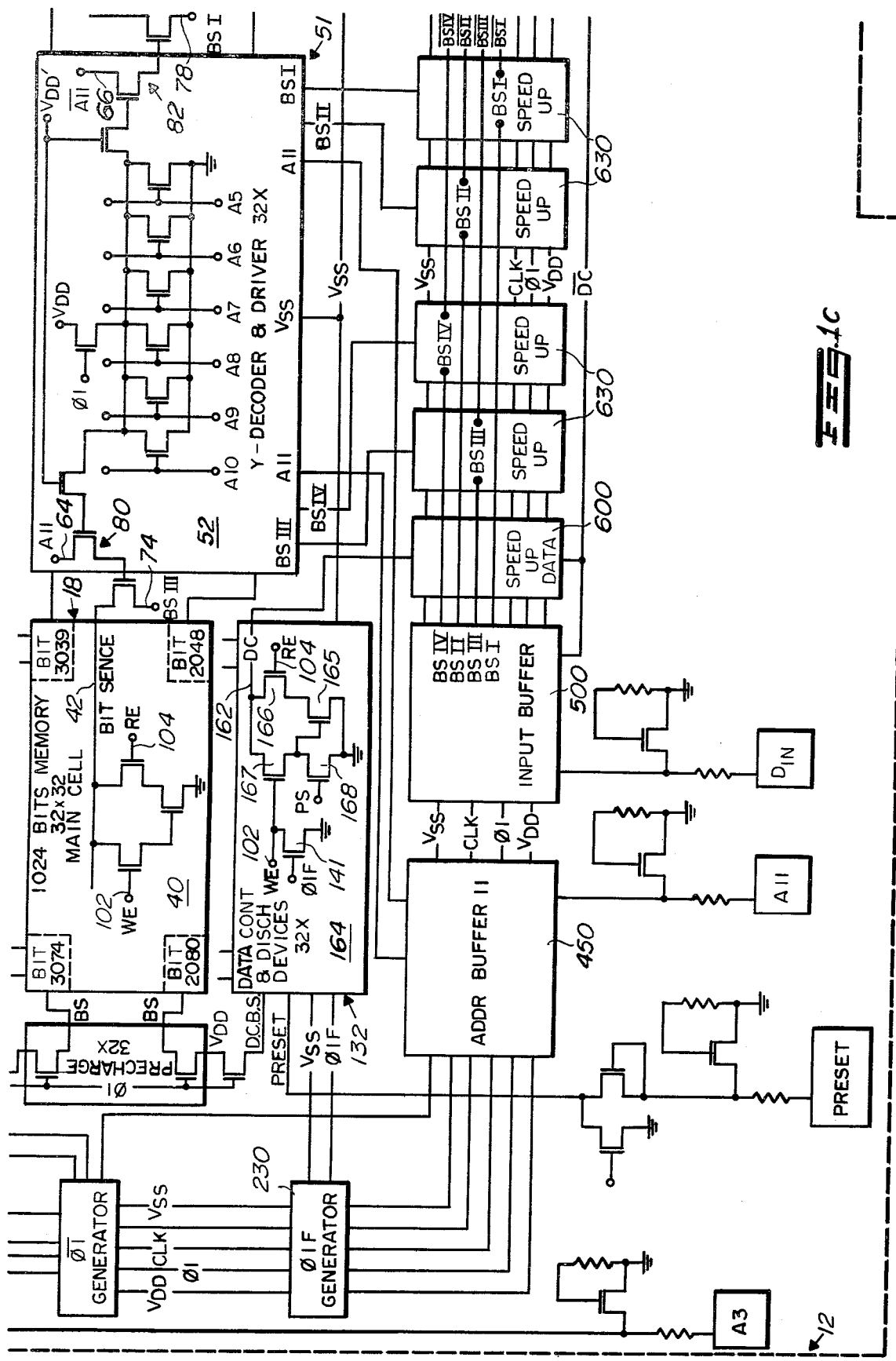
Figure 1D:
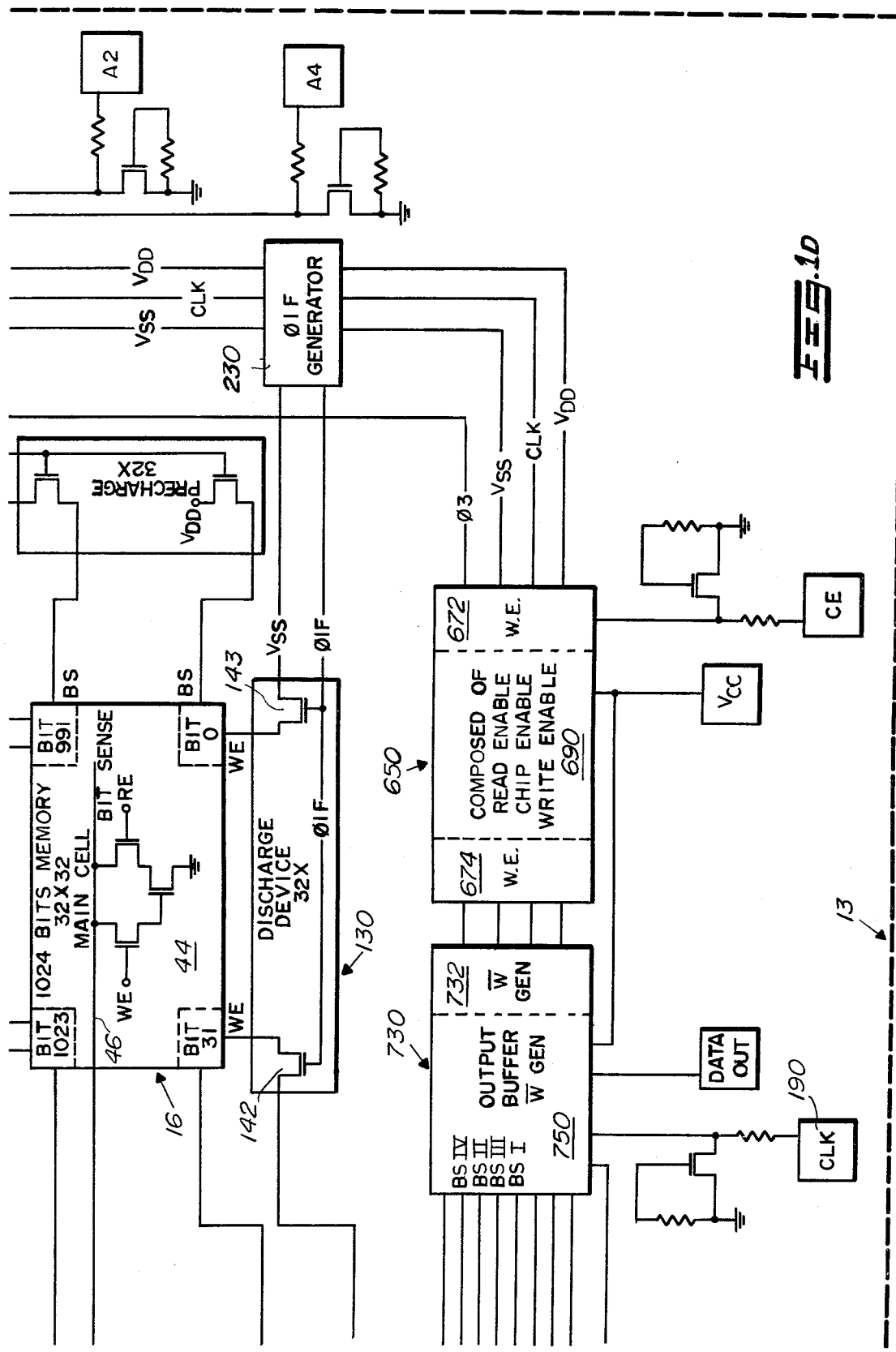

FIGS. 1a – 1d constitute four sections of a single drawing which is a partial schematic representation of a 4096 bit MOS RAM. FIG. 1a is the upper left-hand section 10 of the MOS RAM; FIG. 1b shows the upper right-hand section 11; FIG. 1c is the lower left-hand section 12; and FIG. 1d is the lower right-hand section 13. The subsequent description refers to FIGS. 1a – 1d. Quadrants 22, 20, 18 and 16 are each 32 × 32 arrays of MOS dynamic memory cells. A representative RAM cell is schematically illustrated in each of the quadrants, specifically RAM cells 24, 36, 40, and 44. Referring to RAM cell 24, it is seen that it includes the storage transistor 26, a read transistor 28 and a write transistor 30, transistors 26 and 28 being coupled in series between a ground conductor and bit sense line 34, write transistor 30 being coupled between sense line 34 and gate 32 of storage transistor 26.

Those skilled in the art will recognize that MOS transistors have three main electrodes, a gate electrode, a source electrode and a drain electrode. It is well known that MOSFETs are bilateral devices, so that the source and the drain are interchangeable. Hereinafter, description of a source or a drain as such will be understood to designate a particular terminal of the MOSFET, but will not necessarily designate its function as a source or a drain, since this will depend on the relative voltages thereof.

The information is stored on capacitance associated with gate 32. A row of 32 identical storage cells shares bit sense line 34, and there are 32 such rows in quadrant 22. A complete description of the inverting storage cell is given in the abovementioned patent by Hoffman et al. The gate electrode of write transistor 30 is connected to a write line designated WE (Write Enable). Each write line is coupled to the write transistor of 32 storage cells forming a column of 32 devices. Similarly, gates of the read transistors of all storage cells in a column share a common Read Enable line designated RE. For convenience, each storage cell or "bit" in the major array (which consists of the four quadrants) is identified or designated by a number. For example, quadrant 16 includes bits O - 1023, bit O being in the lower right-hand corner of quadrant 16. Bit 4095 occurs diagonally opposite at the upper left-hand corner of quadrant 22.

Representative bit sense lines 38, 42 and 46 are shown coupled, respectively, to storage cells 36, 40, and 44 in the respective quadrants.

The twelve address inputs AO - A11 are used to select one out of the 4096 bits. Selection of one of 4096 bits is achieved by selecting one row and one column in each of the left and right hand halves of the entire major memory array and then selecting either the right or the left half of the major array. Selection of the one of 32 rows of the upper half of the memory array is accomplished by one of 32 Y decoder and driver circuits in section 49, of which Y decoder/driver circuit 50 is a representative example. One of the 32 rows in the lower half of the memory is accomplished by means of one of the 32 Y decoder/driver circuits such as 52 in the section 51.

Y decoder/driver 50 includes a load device clocked by $\phi 1$ conductor 68 and includes six switching devices 54, each being connected to one of the 64 combinations of the address inverter outputs. Devices 54 and 53 form a NOR gate, the output of which is coupled by two series connected MOSFETs 56 and 58 to the gate electrodes of coupling MOSFETs 62 and 60, respectively. Coupling MOSFET 62 couples one of the 32 bit sense lines to the quadrant bit sense line designated BSIV. Similarly, MOSFET 60 couples its sense line 38, which is one of the rows in quadrant 20, to BSII. Similarly, BSI and BSIII are coupled to one of 32 bit sense lines in quadrants 18 and 16, respectively, by coupling devices 80 and 82 of decoder driver 52. To summarize, one of 64 Y decoder/driver circuits selects one row out of 64 rows, and couples the bit sense line for the left-hand side of the memory array to one of the quadrant bit sense lines and also couples one of the bit sense lines corresponding to the selected row for the right-hand side of the memory array to another of the quadrant bit sense lines. The $A_{11}$ address buffer then selects which side, either the left-hand side or the right-hand side, of the memory is selected.

In order to select a single cell out of the 4096 bit array, one column is selected from each of the right and left-hand sides of the memory, and the cell at the intersection at the selected column and selected row of the selected half of the memory is then coupled by means of the bit sense line for that cell and the bit sense line for that quadrant to the read/write circuitry.

X decoder/driver sections 90 and 92, respectively, each contain 32 X decoder/driver circuits, including X decoder driver circuits 94 and 96. Referring to X decoder/driver circuit 94, it is seen that it provides the drive signal applied to the upper Write Enable (WE) and Read Enable (RE) lines 98 and 100, and also lower WE and RE lines 102 and 104. Similarly, the drive portion of decoder/driver 96 generates the upper and lower WE and RE lines. The X decoder/driver circuits in sections 90 and 92 include five input NOR gate sections similar to the NOR gates of the Y decoder/driver circuits; the inputs are connected to the 32 binary combinations of the address variables A0 - A4, so that one of the 32 columns for each half of the memory are selected thereby. Output 106 of the NOR gate section of X decoder/driver 94 drives upper driver circuit 110 and lower driver circuit 108. Upper X driver circuit 110 includes MOSFETS 112 and 114 having their gates connected to $V_{DD}'$ and their sources connected to output 106. The source of MOSFET 112 is connected to one terminal of capacitor C6 and to the gate of coupling MOSFET 116, which has its source connected to $\phi 2$ and its drain connected to RE line 100, which is also connected to the other terminal of capacitor C6. MOSFET 118 has its source connected to $\phi 3$ and its drain connected to WE line 98 and the other terminal of C5, the first terminal of C5 being connected to the gate of MOSFET 118 and the source of MOSFET 114. The structure of lower X driver circuit 108 is entirely similar to that of upper X driver circuit 110. Thus, it is seen that for one of the 32 decoder/drivers in each of sections 90 and 92 which is selected, output 106 is high after the decoding delay time, turning the respective coupling MOSFETs on, so that the signal $\phi 3$ is coupled to WE lines 98 and 102 and $\phi 2$ is coupled to RE lines 100 and 104. Thus, an entire column of storage cells in each half of the memory is selected.

The externally applied power supply voltage is designated $V_{DD}$. However, for the X and Y driver circuits described above, an internally generated voltage designated $V_{DD}'$ is generated. Circuits 120, 126, 128 and 130 generate the $V_{DD}'$ voltages required by the X and Y decoder/driver circuits. Circuit 120 includes MOSFETs 122 and 124, each having their drain connected to $V_{DD}$ and their gate connected to $V_{DD}$. The source of MOSFET 122 is connected to $V_{DD}'$ line 132 and the source of MOSFET 124 is connected to $V_{DD}'$ line 134.

The reason for generating the voltage $V_{DD}'$, which is equal to $V_{DD}-V_{TH}$ is a threshold voltage of MOSFETs 122 and 124, is that the load devices of the X and Y decoder NOR gates precharge the respective outputs only to $V_{DD}-V_{TH}$ volts. Thus, it is desirable to have only $V_{DD}-V_{TH}$ applied to the gates of, for example, MOSFETs 56 and 58 (for Y decoder/driver 50) and MOSFETs 112 and 114 (for X decoder/driver 94), so that these MOSFETs completely isolate the NOR gate outputs from the coupling devices (MOSFETs 60 and 62 for Y decoder/driver 50 and MOSFETs 116 and 118 for X decoder/driver 94). Then, the bootstrapping action of the driver circuits is relatively uimpaired by the capacitance associated with NOR gate outputs.

Sections 130, 132, 134 and 136 each contain 32 discharge devices, each having their source connected to $V_{SS}$ (also referred to herein as ground) and their drain connected, respectively, to one of the 32 WE lines for the adjacent quadrant. The gate of each of the discharge devices is connected to a $\phi1_F$ conductor. The $\phi1_F$ signal is generated by the clock generating system described hereinafter. In the partial schematic of FIGS. 1a– 1d, representative discharge devices are 137, 138, 139, 140, 141, 142 and 143. The purpose of the discharge devices is to help discharge all of the WE lines to ground before the bit sense lines 34, 38, 42, and 46 are precharged by the $\phi1$ clock signal, as is described hereinafter. Section 136 also includes 32 bit sense timing control circuits, a representative one of which is designated by reference numeral 146 and which includes two MOSFETs 148 and 150 connected in series between the ground conductor and timing bit sense line 152. The gate of MOSFET 150 of each of the timing bit sense cells is connected to the RE line (100) of the corresponding column of storage cells. The gate of MOSFET 148 is connected the the $V_{REF}$ which includes four MOSFETs coupled in series between $V_{DD}$ and $V_{SS}$, the upper three of which are diode-connected MOSFETs 156, 158 and 159; the gate of MOSFET 160 is connected to CLK conductor. The voltage generated at the gate of MOSFET 159 is designated $V_{REF}$.

Section 132 includes 32 data control devices, one connected to the WE line and the RE line of each of the 32 columns of quadrant 18. The data control devices are all coupled to a data control line (DC) designated by numeral 162. Each data control device 164 includes a storage transistor 165, a read transistor 166 and a write transistor 167 connected in a configuration similar to that of the storage cells 40, etc. It also includes a MOSFET 168 connected between ground and the gate of MOSFET 165. MOSFET 168 has its gate connected to the PS (Preset) conductor to which an external signal may be applied to initialize the state of the data control cells, to, for example, facilitate testing of the MOS RAM chip. An internal power on reset circuit could also be provided to generate the present signal.

Each of the bit sense lines, such as 34, 38, etc., is coupled to a precharge device having its drain connected to $V_{DD}$ and its gate connected to $\phi1$ and its source connected to the respective bit sense line. Representative bit sense precharge devices for quadrant 22 include MOSFET 170 to precharge the bit sense line for the first row of that quadrant (172) and MOSFET 180 to precharge the bottom bit sense line 182 for quadrant 22. The bit sense lines in the other quadrants are precharged by similar devices shown in FIGS. 1a – 1d.

The MOS RAM of FIGS. 1a – 1d requires a number of different clock signals for operation, including, CLK, $\overline{\phi1}$, $\overline{\phi1_F}$, $\phi1_{FF}$, $\phi2$, $\phi3$, and $\overline{\phi_1}'$. The latter six clock signals are derived from CLK; $\phi3$ is additionally controlled by the R/W (Read/Write) input signal.

CLK is externally applied to pad 190 (FIG. 1c). The circuits generating the above-named signals are described hereinafter.

A $\phi1$ generator is schematically depicted in FIG. 2. Referring to FIG. 2, $\phi1$ generator 198 includes a portion which is essentially a bootstrap NOR gate which includes MOSFETs 208 and 210 connected in parallel between ground and node 218. Load MOSFET 212 is connected between $V_{DD}$ and node 218. Bootstrap charging MOSFET 216 is connected between $V_{DD}$ and the gate of MOSFET 212. Bootstrap capacitor C4 (214) is connected between node 218 and the gate of MOSFET 212. The gate of MOSFET 216 is connected to $V_{DD}$. Disable MOSFET 224 is connected between ground and node 219, and has its gate coupled to CLK. $\phi1$ generator 198 also includes a push-pull inverter circuit which includes MOSFET 220 connected between $V_{DD}$ and node 228 and has its gate connected to CLK and also includes MOSFET 222 connected between node 228 and ground and having its gate connected to $\phi1_F$ conductor 232. $\phi1_F$ is the complement of CLK, and is delayed by the inverter delay of the $\phi1_F$ generator 230 of FIG. 7. $\phi1$ generator 198 includes an output driver including parallel MOSFETs 200 and 202 coupled in parallel between ground and node 226, which is the $\phi1$ conductor. MOSFET 200 has its gate coupled to node 228 and MOSFET 202 has its gate coupled to CLK. The output driver also includes load MOSFET 206 and leakage MOSFET 204 connected in parallel between node 226 and $V_{DD}$, the gate of leakage MOSFET 204 being also connected to $V_{DD}$ and the gate of MOSFET 206 being connected to bootstrap node 219.

Referring to FIG. 7, $\phi1_F$ generator 230 is a conventional bootstrap driver whch includes a bootstrap inverter state including switching MOSFET 234 having its gate connected to CLK and its drain connected to MOSFET 236, which has bootstrap capacitance 240 coupled between its source and gate and bootstrap charging diod-connected MOSFET 238 connected between $V_{DD}$ and the gate of load MOSFET 236. Output 242 of the bootstrap inverter is connected to the load MOSFET 248 of a push-pull output driver, which includes MOSFET 248 connected between $V_{DD}$ and output conductor 232 at which $\phi1_F$ is generated. Switching MOSFET 246 is connected between node 232 and ground and has its gate connected to CLK.

The $\phi2$ clock signal is generated by the circuitry 250 in FIG. 4, which includes dummy decoder discharge circuit 252, timing control delay circuit 262, and $\phi2$ generator circuit 276. Dummy decoder discharge circuit 252 is simply a dynamic two input NOR gate including parallel switching MOSFETs 254 and 256 coupled between ground and output node 260 and having their gates connected, respectively, $A_{10}$ to $\overline{A_{10}}'$ which are the outputs from the $A_{10}$ address input buffer, to be described hereinafter. Of course, it is not necessary that the $A_{10}$ address input buffer be used; any of the 12 input address buffer outputs could be used, as will become clearer in the subsequent description of the operation. Load MOSFET 258, clocked by $\phi1$ is connected between $V_{DD}$ and node 260, which generates an output signal designated by the reference letter A.

In FIG. 4, timing control delay generator 262 includes a first dynamic inverter stage including load MOSFET 264 coupled between $V_{DD}$ and node 272 and clocked by CLK and switch MOSFET 266 coupled between node 272 and ground having its gate connected to timing bit sense line 152 (FIG. 1a) which is generated by the 32 dummy sense bits, or timing control, associated with quadrant 22. Signal B, generated at node 272, is utilized in $\phi2$ generator 276, and also serves as an input to the inverter including MOSFETs 268 and 270 which generates a signal at output 274.

MOSFET 270 has its gate connected to node 272 and is coupled between node 274 and ground. MOSFET 268 has its gate connected to $\phi 1$ and its drain connected to $V_{DD}$ and its source connected to node 274.

Referring to FIG. 4, $\phi 2$ generator 276 includes a bootstrap NOR-type input section including input MOSFETs 278 and 280 connected in parallel between node 281 and ground, load MOSFET 282 connected between $V_{DD}$ and 281. Bootstrap capacitor 284 is connected between node 281 and the gate of MOSFET 282, and bootstrap charging MOSFET 286 is connected between $V_{DD}$ and the gate of MOSFET 282 having its gate connected to CLK and disable MOSFET 290 is connected between node 285 and ground. Node 260 is coupled to the gate of MOSFET 278, and node 272 is connected to the gate of MOSFET 280 and also to the gate of MOSFET 290. $\phi 2$ generator 276 also includes an output buffer including pull-up MOSFET 292 connected between output node 300 and $V_{DD}$ having its gate connected to the gate of MOSFET 282. MOSFETs 294, 296, 298 are coupled between output node 300 and ground, MOSFET 298 having its gate connected to MOSFET 296 having its gate connected to node 260, and MOSFET 294 having its gate connected to node 272.

Referring to FIG. 5, $\phi 3$ is generated by circuitry in section 302 which includes R/W generator 304 and $\phi 3$ generator 308; $\phi 1_{FF}$ generator 306 is also included in section 302 for convenience. R/W generator 304 includes in inverter stage including MOSFET 308 connected between node 318 and $V_{DD}$ having its gate connected to CLK and MOSFET 306 connected between node 318 and ground having its gate connected to R/W input conductor 316. R/W generator 304 also includes an output inverter including MOSFET 310 connected between output node 314 and $V_{DD}$ and having its gate connected to CLK. It also includes switch MOSFET 312 connected between 314 and ground and having its gate connected to node 318. Output signal R/W is generated at node 314.

$\phi 1_{FF}$ generator 306 is a conventional bootstrap inverter including switch MOSFET 320 coupled between ground and node 322 having its gate connected to CLK and also including MOSFET 326 connected between $V_{DD}$ and node 322 and bootstrap capacitor 323 connected between node 324 and 322, the gate of MOSFET 326 being connected to node 324. Bootstrap charging MOSFET 328 has its gate and drain connected to $V_{DD}$ and its source connected to node 324.

In FIG. 5, $\phi 3$ generator 308 consists of a first stage which is essentially a four-input clocked bootstrap NOR gate and a second stage which is also essentially a four-input clocked bootstrap driver stage which produces $\phi 3$ at its output.

$\phi 3$ generator 308 includes MOSFET 332 coupled between CLK and node 333 and has its gate coupled to $V_{DD}$. MOSFET 330 is coupled between $V_{DD}$ and node 355 and has its gate coupled to node 333. Bootstrap capacitor 336 is coupled between nodes 333 and 355. MOSFETs 338, 340, 342, and 344 are coupled between node 355 and ground and have their gates coupled respectively, to $\phi 2$, $\overline{TCD}$, R/W', and $\phi 1_{FF}$. MOSFET 334 is coupled between $V_{DD}$ and node 353 and has its gate coupled to node 333. MOSFET 346, 348, 350 and 352 are coupled between node 353 and ground and have their gates coupled, respectively to $\phi 1_{FF}$, $\phi 2$, $\overline{TCD}$ and R/W'.

Referring to FIG. 6, $\overline{\phi 1}'$ generator 360 includes a first stage which is a dynamic NOR gate including MOSFETs 362 and 364 coupled in parallel between ground and node 376, having their respective gate electrodes connected to the outputs of an address buffer described hereinafter. The NOR gate also includes load device 368 coupled between $V_{DD}$ and node 376 having its gate connected to $\phi 1$. $\overline{\phi 1}'$ generator 360 also includes a bootstrap inverter output driver including MOSFET 366 connected between ground and output node 378 and having its gate connected to node 376, MOSFET 372 connected between $V_{DD}$ and node 278 and having its gate connected to node 371 and having bootstrap capacitor 374 connected between node 371 and node 378. MOSFET 370 is connected between CLK and the gate of MOSFET 372. The gate of MOSFET 370 is connected to $V_{DD}$.

Address buffer 390 includes a cross-coupled latching section including MOSFET 392 coupled between node 430 and $V_{DD}$ having its gate connected to CLK. MOSFET 394 is connected between nodes 430 and 422 and has its gate connected to node 426. MOSFETs 396 and 398 are coupled in parallel between node 422 and ground, MOSFET 396 having its gate connected to $\phi 1$ and MOSFET 398 having its gate connected to node 428. Bootstrap capacitor 400 is connected between CLK and node 426; bootstrap capacitor 422 is connected between CLK and node 428. MOSFET 404 is connected between nodes 430 and 424 and has its gate connected to node 428. MOSFETs 406 and 408 are connected in parallel between ground and node 424, MOSFET 406 having its gate connected to $\phi 1$ and MOSFET 408 having its gate connected to node 426. Address buffer 390 also includes MOSFET 410 connected between $V_{DD}$ and node 428 having its gate connected to $\phi 1$ and MOSFET 412 connected between nodes 428 and 432 having its gate connected to CLK and the MOSFET 414 connected between node 432 and ground and having its gate connected to an address input conductor. Also included is MOSFET 416 connected between $V_{DD}$ and node 426 having its gate connected to $\phi 1$ and MOSFET 418 connected between nodes 426 and 434 having its gate connected to CLK and MOSFET 420 connected between node 434 and ground having its gate connected to node 432.

In FIG. 8, address buffer 11 is identical in topology to address buffer 390 which is used for the other address inputs and is designated by reference numeral 450, except that additional decoding circuitry is connected to nodes 422 and 424.

MOSFET 452 is connected between nodes 422 and 453 and has its gate connected to CLK. MOSFET 456 is connected between $\overline{\phi 1}'$ conductor 378 and $A_{11}$ output node 64 and has its gate connected to node 453. Bootstrap capacitor 454 is connected between conductor 378 and node 453. MOSFETs 458 and 460 are connected in parallel between node 64 and ground and have their gates connected, respectively, to nodes 424 and $\phi 1$. MOSFET 462 is connected between node 424 and 463 and has its gate connected to CLK. MOSFET 468 is connected between $A_{11}$ output node 66 and node 378 ($\overline{\phi 1}'$) and has its gate connected to node 463. Bootstrap capacitor 464 is connected between nodes 378 and 463. MOSFETs 470 and 472 are connected in parallel between nodes 456 and ground and have their gate electrodes connected, respectively, to nodes 422 and $\phi 1$.

In FIG. 9, data input buffer 500 includes MOSFET 509 connected between $V_{DD}$ and node 510 having its gate connected to W conductor 508. MOSFETs 502 and 504 are connected in parallel between ground and node 510 and have their gates connected, respectively, to Data In ($D_{IN}$) conductor 506 and $\phi 1$. MOSFET 520 is connected between $V_{DD}$ and node 516 and has its gate connected to $\phi 1$. MOSFET 512 is connected between node 516 and ground and has its gate connected to node 510. MOSFETs 514 and 518 are connected in series between node 516 and ground, and have their gates connected, respectively, to $\overline{DC}$ (Data Control) node 522 and W node 508. MOSFET 526 is connected between CLK and node 527 and has its gate connected to $V_{DD}$. MOSFET 528 is connected between $V_{DD}$ and node 542 and has its gate connected to node 527. Bootstrap capacitor 529 is connected between nodes 542 and 527. MOSFET 524 is connected between node 542 and ground and has its gate connected to node 516. MOSFETs 543 and 530 are connected in series between node 542 and ground and have their gates connected, respectively, to nodes 510 and 522. MOSFET 538 is connected between $V_{DD}$ and node 540 and has its gate connected to W conductor 508. MOSFETs 536 and 539 are connected in parallel between nodes 540 and ground and have their gates connected, respectively, to nodes 542 and $\phi 1$. MOSFET 544 is connected between BSI and $V_{DD}$ and has its gate coupled to node 542. MOSFET 546 is coupled between BSI and ground and has its gate coupled to node 540. Similarly, MOSFETs 548, 552, and 556 have their gates coupled to node 542 and are coupled between $V_{DD}$ and BSII, BSIII, and BSIV, respectively. MOSFETS 550, 554 and 558 have their gates coupled to node 540 and are coupled between ground and BSII, BSIII and BSIV, respectively.

Section 600 in FIG. 10 includes speed-up turn-off circuit 601 and data control inverter 603. Speed-up turn-off circuit 601 includes a dymanic two-input NOR gate including load device 610 coupled between $V_{DD}$ and node 611 with gate to CLK and MOSFETs 612 and 614 coupled in parallel between node 611 and ground and having their gates coupled, respective, to W node 508 and $\phi 1$. The second stage of circuit 601 includes an inverter having diode-connected load MOSFET 616 coupled between $V_{DD}$ and output node 612 and switch MOSFET 618 coupled between node 612 and ground and having its gate connected to node 611. The data control inverter includes MOSFET 620 coupled between $V_{DD}$ and node 622 having its gate connected to CLK and switch MOSFET 624 coupled between node 622 and ground having its gate connected to DC (data control).

Referring to FIG. 11, speed-up circuit 630 includes MOSFET 632 coupled between CLK and node 634 having its gate connected to $V_{DD}$. MOSFET 636 is coupled between $V_{DD}$ and node 638 and has its gate connected to node 634. Bootstrap capacitor 633 is coupled between node 634 and 638. MOSFETS 640 and 642 are gates connected, respectively, to node 612 and 70 MOSFET 646 is coupled between $V_{DD}$ and node 70 and MOSFET 644 is coupled between node 70 and ground and has its gate connected to node 638. MOSFET 646 has its gate connected to $\phi 1$.

In FIG. 12, section 650 includes a chip enable buffer 672 which includes MOSFET 652 coupled between $V_{DD}$ and node 654 and having its gate coupled to CLK and MOSFETs 658 and 656 coupled in parallel between node 654 and ground having their gates connected, respectively, to $\overline{CE}$ and $\phi 1$.

Write Enable buffer 674 includes MOSFET 676 coupled between $V_{DD}$ and node 679 having its gate connected to CLK. MOSFET 678 is connected between ground and node 679 and has its gate connected to $\overline{CE}$. MOSFET 682 is connected between $\phi 3$ and node 508 and has its gate connected to node 679. Bootstrap capacitor 680 is connected between nodes 679 and 508. MOSFET 686 is connected between node 508 and ground and has its gate connected to $\phi 1$. Read Enable buffer 690 includes a NOR gate including MOSFET 692 connected between $V_{DD}$ and 694 having its gate connected to CLK. MOSFETs 696 and 698 are connected between node 694 and ground and have their gates connected, respectively, to $\overline{CE}$ and $\phi 1$. MOSFET 700 has its gate and drain connected to $V_{DD}$ and its source to node 702 which generates $R_{EN}$. MOSFET 704 is connected between node 702 and ground and has its gate coupled to node 694. Note that the small parallelograms such as 712 in the drawing indicated connections which are provided for an interconnection option and which are open-circuited to allow use of external Exclusive OR circuitry. The pairs of parallel lines such as 716 are open-circuited in the case of Exclusive OR circuitry being provided on the chip, and are short-circuited for an option in which external Exclusive OR circuitry is used.

The term "Exclusive OR type circuit" used herein refers to either an Exclusive OR or and Exclusive NOR circuit. The term Exclusive OR' in has a similar connotation.

MOSFET 706 is connected between $C_{01}$ and node 707 and has its gate connected to node 694, (CEA). MOSFET 708 is connected between $V_{DD}$ and node 707 and has its gate connected to node 711. MOSFET 710 has its gate connected to W; node 746, and is connected between node 711 and $\overline{DC}$.

Figure 13:
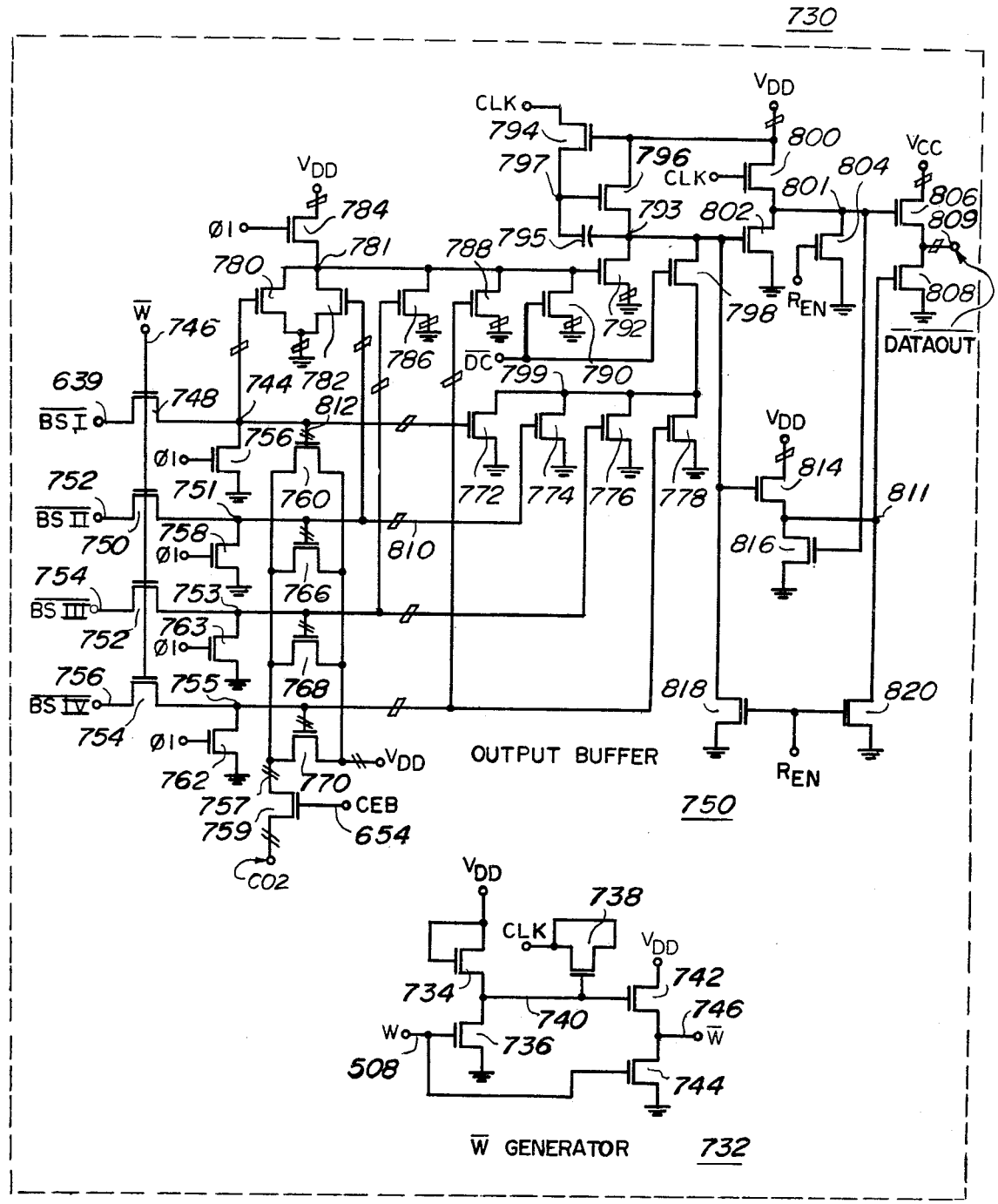
FIG. 13 is a schematic diagram of the W signal generator circuit and the output buffer circuit utilized from the memory of FIGS. 1a – 1d.

FIG. 13 shows a schematic diagram of circuit section 730 which includes W generator 732 and output buffer 750. $\overline{W}$ generator 732 includes MOSFET 734 connected between $V_{DD}$ and node 740 with its gate connected to $V_{DD}$ and MOSFET 736 connected between node 740 and ground having its gate conneced to W, node 508. Bootstrap capacitor 738 is connected between CLK and node 740. MOSFET 742 is connected between $V_{DD}$ and $\overline{W}$, node 746, and has its gate connected to node 740. MOSFET 744 is connected between node 746 and ground nad has its gate connected to node 508.

Output buffer 750 accepts signals from $\overline{BSI}$ (node 639), $\overline{BSII}$, (node 752), $\overline{BSIII}$ (node 754) and $\overline{BSIV}$ (node 756). Coupling MOSFETs 748, 750, 752 and 754 couple nodes 639, 752 754 and 756, respectively, to nodes 748, 751, 753, and 755, and each have their gates connected to $\overline{W}$, node 746. MOSFET 784 is connected between $V_{DD}$ and node 781 and has its gate connected to $\phi 1$. MOSFETs 780, 782, 786, 788 and 790 are coupled in parallel between node 781 and ground and have their gates connected, respectively, to nodes 744, 751, 753, 755 and $\overline{DC}$. In FIG. 13, the small parallelogram such as 810 indicates a solid connection for on-chip Exclusive OR type circuitry and an open connection for the option in which the Exclusive OR function is performed off the chip, while the closely spaced sets of parallel lines indicate a short circuit connection for off-chip Exclusive Or'ing and an open connection for onchip Exclusive Or'ing. MOSFETs 756, 758, 760 and 762 all have their gates connected to $\phi1$ and are connected, respectively, between ground and nodes 744, 751, 753, and 755. MOSFETS 760, 766, 768 and 770 are coupled in parallel between $V_{DD}$ and nodes 757 and have their gates coupled, respectively, to nodes 744, 751, 753 and 755. MOSFET 759 is coupled between $C_{02}$ and node 757 and has its gate connected to node 654, designated CEB. MOSFET 792 is coupled between node 793 and ground and has its gate connected to node 781. Bootstrap capacitor 795 is coupled between node 797 and node 793. MOSFET 796 is coupled between $V_{DD}$ and node 793 and has its gate connected to node 797. MOSFET 794 is coupled between CLK and node 797 and has its gate connected to $V_{DD}$. MOSFET 798 is connected node 793 and node 799 and has its gate connected to $\overline{DC}$.* MOSFET 800 is connected between $V_{DD}$ and node 801 and has its gate connected to CLK. MOSFET 802 has its gate connected between node 801 and ground and has its gate connected to node 793. MOSFET 804 is connected between nodes 801 and ground and has its gate connected to $R_{EN}$. MOSFET 806 is connected between $V_{CC}$ AND DO (Data Out) output node 809 and has its gate connected to node 801. MOSFET 808 is connected between 809 and ground and has its gate connected to node 811. MOSFET 814 is connected between $V_{DD}$ and note 811 and has its gate connected to node 793. MOSFET 816 is connected between node 811 and ground and has its gate connected to node 801. MOSFET 818 is connected between gate node 793 and ground and has its gate connected to $R_{EN}$. MOSFET 820 is connected between node 811 and ground and has its gate connected to $R_{EN}$.

*MOSFETS 772, 774, 776, and 778 are coupled in parallel between ground and node 799 having their gates connected respectively, to nodes 744, 751, 753, and 755.

Figure 14:
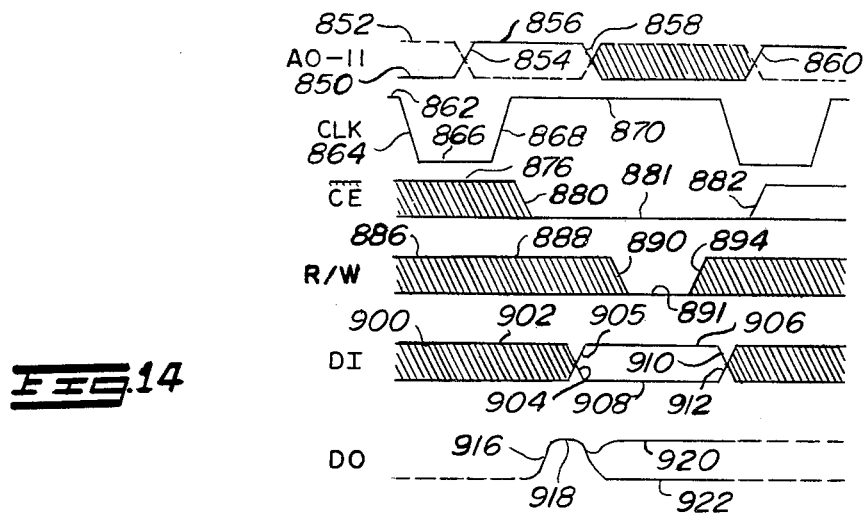
FIG. 14 is a timing diagram depicting the external signals applied to and received from the memory of FIGS. 1a – 1d, and is useful in describing the operation of the memory.

FIG. 14 is a diagram depicting the signals at the external connections of the MOS RAM system shown in FIGS. 1a– 1d. The waveforms in FIG. 14 indicate a read-write cycle. A brief description of the operation of the 4096 bit dynamic MOS RAM follows, referring to the timing diagram of FIG. 14. the RAM uses three transistor storage cells in an inverting cell configuration. The single high-level clock, CLK, starts an internal three phase clock generator circuit which controls the read and write functions of the device. The $\phi1$ signal, which is high when CLK is low (stand-by mode) preconditions the nodes in the dynamic RAM in preparation for a memory cycle. The $\phi2$ signal, which comes on as CLK goes high is the read control signal and transfers data from memory cell storage onto bit sense lines. The $\phi3$ signal, which comes after $\phi2$ only during a write or refresh cycle, transfers data drom the bit sense lines back into storage. The $\phi3$ signal occurs only when the R/W input is low.

To perform a read cycle, CLK is brought high to initiate a $\phi2$ signal. The X decoders select one column in each of the four storage quadrants (FIGS. 1a–1d). The Y decoder selects one of the 128 bit sense lines for read and write operation. During the $\phi2$ signal, the data on this selected bit sense line is Exclusive OR'ed with the state of the appropriate data control cell to supply the correct output data. After this data is received by the external system, CLK may be brought low to the stand-by position. This assumes that the R/W signal is being held high to prevent any internal $\phi3$ pulse from being generated.

To perform a write or refresh operation, CLK is brought high and everything is identical to a read operation up to the point at which the 128 bit sense lines are charged by the selected storage cells in the selected columns. When R/W is brought low (if it is not already low) a $\phi3$ signal is generated after $\phi2$ is over. The $\phi3$ signal takes the data from the 128 bit sense lines and returns it to the 128 storage locations it came from. Because of the design of the memory array, this $\phi2$-$\phi3$- read-write operation inverts the data. Therefore, one extra row of memory cells, called data control cells, is used to keep track of the polarity of the stored data in each column of storage cells in order to correctly recover it. During the write operation, the input data is Exclusive OR'ed with the control cells before being stored in the array. The refresh cycle does not modify any of the bit sense lines, but simply returns the data, (now inverted) into storage. All timing signals for the MOS RAM are specified around these operations. The following is a brief description of the input signals, the output signals, and relevant timing requirements, referring to FIG. 14.

CLK is a single clock which initiates all memory cycles. CLK can remain either OK high or low as long as desired for specific operations as long as a minimum refresh requirement is met.

The $\overline{CE}$ signal controls only the input/output buffers. When $\overline{CE}$ is high, the input is disconnected and the output is in the tri-state or high impedance state. Therefore, a refresh cycle is essentially a write cycle with $\overline{CE}$ high.

R/W (read/write), when high, inhibits an internally generated $\phi3$ signal for writing. When R/W is low, a $\phi3$ pulse will occur soon after $\phi2$ goes low. If $\phi2$ is already finished, as in a read-modify-wirte cycle, $\phi3$ will start at once. For a write cycle, an overlap of $\overline{CE}$, CLK, and R/W is required, an overlap of CLK and R/W is required for a refresh cycle.

Signals on the Data In line are ignored when either $\overline{CE}$ or R/W is high, or CLK is low. $D_{IN}$ (data in) must be held valid for sifficient time to override the data stored on the selected bit sense line. The preset line (PS) during normal use, is tied to ground. However, during device testing PS can be used to present the data control cell to a logical O. A two microsecond pulse will set all 32 cells simultaneously, and insure a good logic level in the data control cells after the first power up transition. In system use, a good logic level will come natrually after the first few refresh cycles, but use of the present input is very valuable in testing the devices.

The MOS 4096 bit RAM is refreshed by performing a refresh or a write cycle on each of the 32 combinations of the five least significant address bits $A_0 - A_4$ within a 2 millisecond time period. This can be done in a burst mode or a distributed mode. A refresh abort can be accomplished by treating a refresh cycle as a read-modify-write cycle with $\overline{CE}$ high. This type of cycle can be aborted at any time until the R/W signal has been brought low to allow the $\phi3$ clock to begin.

The operation of the internal clock generating circuitry is described with reference to the timing diagrams of FIGS. 14 and 15. The externally applied signal, CLK, is shown in both FIGS. 14 and 15. In one practical implementation of the MOS RAM in which $V_{DD}$ is 12 volts and $V_{SS}$ is ground or zero volts, CLK has a 12 volt logic swing. In order to describe the operation of the $\phi1$ generator circuit in FIG. 2, the operation of the $\phi1_F$ generator circuit in FIG. 2, the operation of the $\phi1_F$ generator of FIG. 7 must also be described. Assume initially that CLK is high, that is, at approximately $V_{DD}$ volts. Then, referring to FIG. 7, $\phi1_F$, node 232, is approximately at ground because MOSFETs 234 and 246 are both on. Node 242 is also at ground, being held at ground by MOSFET 234, and consequently MOSFET 248 is off. MOSFETT 244 is an optional high impedance load device provided to given an added margin of safety. Since node 242 is at ground, bootstrap charging MOSFET 238 maintains at its source a voltage equal to $V_{DD}-V_{TH}$ volts and causes bootstrap capacitor 240 to be charged to this voltage. Referring to FIG. 2, $\phi1$, node 226, is approximately at ground because MOSFETs 200, 208, 210 and 202 are all on. MOSFET 220 maintains node 228 at $V_{DD}-V_{TH}$ volts, holding MOSFETs 202 and 210 on. MOSFET 222 is off since $\phi1_F$ is at ground. CLK also maintains MOSFET 224 in the on condition, so that node 219 is at ground. Then, the only DC path between $V_{DD}$ and ground is through MOSFETs 216 and 224, both of which may be relatively high impedance devices, so that very low power dissipation results for the generator 198 when CLK is high. MOSFET 204 is an optional high impedance leakage device comparable to MOSFET 244 in FIG. 7. MOSFETs such as 202, 200, etc., which are connected between an output node and ground, may be referred to as switch MOSFETs or pull-down MOSFETS. The portion of the circuit of FIG. 7 including switching MOSFET 234, load MOSFET 236, bootstrap charging MOSFET 238, and bootstrap capacitor 240 is well known in the art and is described herein as a bootstrap inverter circuit. The output circuit portion thereof, including load MOSFET 248 and switch MOSFET 246 is referred to as a push-pull driver circuit and the combination of the push-pull driver circuit and the bootstrap inverter circuit is referred to herein as a bootstrap driver circuit. However, the term bootstrap driver circuit is frequently also used to designate other drive circuits which have an active load device having its gate coupled to a bootstrap capacitor.

As the leading edge 930 of CLK goes from $V_{DD}$ to ground, MOSFETs 202, 208 and 224 in FIG. 2 are turned off, and node 219 is charged by MOSFET 216 toward $V_{DD}$. MOSFET 220 is also turned off, but charge capacitively stored on node 228 keeps MOSFET 210 in the on condition for a delay period generated by $\phi1_F$ generator 230 so that bootstrap capacitor 214 is charged up. Referring to FIG. 7, MOSFETs 234 and 246 are turned off during transition 930 of CLK, and load MOSFET 236 pulls node 242 to $V_{DD}$ and $\phi1_F$, node 232, undergoes transition 939 in FIG. 15 to approximately $V_{DD}-V_{TH}$ edge of CLK and the leading edge of $\phi1_F$ may be approximately 20 nanoseconds or so; however, the time to charge up bootstrap capacitor 214 may be only approximately 10 or 15 nanoseconds, so that adequate charging of the bootstrap capacitor 214 occurs efficiently. When $\phi1_F$ goes positive, MOSFET 222 is turned on, node 228 is pulled to ground, MOSFET 210 is turned off, and MOSFET 212 pulls node 218 to $V_{DD}$. Bootstrap capacitor 214 boosts the voltage at node 219 to a voltage which may be substantially more positive than $V_{DD}$, providing a large magnitude drive voltage to MOSFET pull-up device 204, which generates a rapid rise time at node 226 for $\phi1$, which undergoes transition 944, even when loaded by a substantial capacitance.

According to the invention, the greatly improved power dissipation of $\phi1$ generator circuit 198 is achieved by combination of that circuit with the $\phi1_F$ generator circuit 230, which generates the delay between CLK and $\phi1_F$ which allows charging up bootstrap capacitor 214. In one implementation of the invention, the delay between the trailing edge 930 of CLK and the leading edge 944 of $\phi1$ is approximately 35 nanoseconds.

Figure 15:
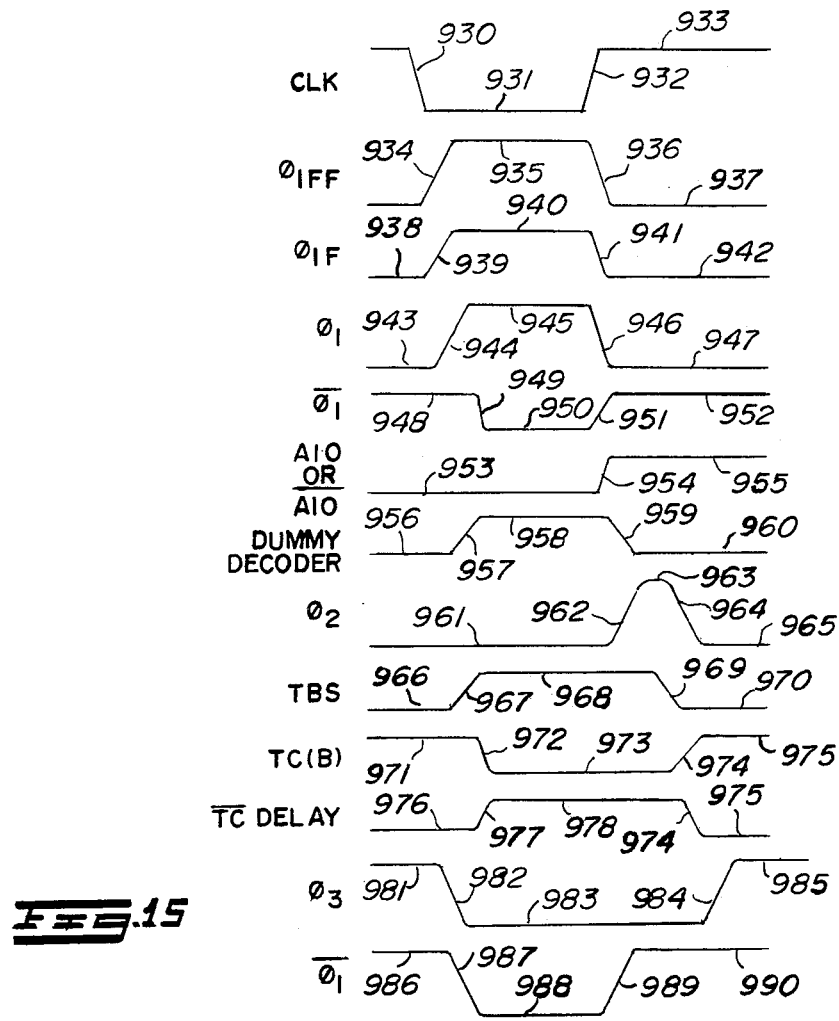
FIG. 15 is a timing diagram illustrating the major internally generated clock signals and timing signals for the memory of FIGS. 1a – 1d and is further useful in describing the invention.

The level of $\phi1$ during waveform section 945 in FIG. 15 is approximately $V_{DD}$ volts. During the positive transition 932 of CLK, CLK returns to $V_{DD}$ volts, turning on MOSFETs 202, 208, 224, 234, and 246 in FIGS. 2 and 7, pulling nodes 226, 218, 219, 242, 232, respectively, to ground. This causes $\phi1_F$ to undergo transition 941 and $\phi1$ to undergo transition 946. Hence, MOSFETs 280, 290 and 294 are initially off. Node 260 of decorder discharge circuit 252 is initially high so that MOSFETs 278 and 296 or $\phi2$ generator 276 are on. When CLK goes positive during transition 932, MOSFET 286 is turned on and node 285 is therefore pulled toward $V_{DD}$ and consequently bootstrap capacitor 284 is charged up. As described above, one of the address inputs $A_{10}$ or $\overline{A_{10}}$ goes positive, discharging node 260 to indicate when the decoding process is complete and at that time MOSFETs 278 and 296 of $\phi2$ generator 276 are turned off, and nodes 281 and 300 are free to rise. Node 281 is pulled toward $V_{DD}$ by MOSFET 282 and the voltage at node 285 is substantially boosted by bootstrap capacitor 284 which causes a large gate to source voltage to be applied to MOSFET 292 which in turn pulls $\phi2$, node 300, toward $V_{DD}$ causing $\phi2$ transition 962 in FIG. 15. Next, when the sensing of the selected storage cell of the RAM is complete, node 272 of the timing delay circuit 262 rises as the timing bit sense line 152 is discharged, turning on MOSFETs 280, 290, and 294 of $\phi2$ generator 276, which pulls nodes 281, 285 and $\phi2$, node 300, to ground causing $\phi2$ transition 964. $\phi2$ stays at level 965, FIG. 15, until the next time the dummy decoder discarge circuit 252 is activated, discharging node 260 to ground.

The subsequent discussion is made with reference to FIG. 5 and describes the operation of the circuitry which generates the internal $\phi3$ clock signal. (It should be noted that the worst case storage cell sensing situation is simulated by providing the timing control discharge devices at the far end of the RE lines and by providing additional capacitive loading on the timing bit sense line 152.) As was mentioned earlier, a $\phi3$ pulse is generated only during a write cycle. The circuitry required to generate the $\phi3$ pulse is illustrated in FIG. 5. Referring to FIG. 5, the $\phi3$ generator 308 requires input signals from the R/W generator 304 and the $\phi1_{FF}$ generator 306.

Referring to FIG. 14, it is seen that during a read cycle R/W is at a logical 1 and during a write cycle R/W is at a logical O. Referring to R/W generator 304, it is seen that when CLK is high, the logic level at node 316 is inverted at node 318 being designated R/W'. Thus, during a read cycle, R/W' is high, and MOSFETs 342 and 352 of $\phi3$ generator 308 are one, so that $\phi3$, node 353, is at ground, as is node 355.

Referring to $\phi1_{FF}$ generator 306, it is seen that $\phi1_{FF}$ is simply the inverse of CLK, a bootstrap inverter is utilized to give a fast rise time to $\phi1_{FF}$ and a large magnitude logic swing equal to $V_{DD}$ volts. Thus, when CLK goes high, $\phi1_{FF}$ goes to ground, and MOSFETs 344 and 346 of $\phi3$ generator 308 are turned off. The signal $\phi1_{FF}$ is designed to be faster than $\phi1$, so that during transition 930 of CLK, $\phi1_{FF}$ goes through a comparatively fast transition 934 which turns MOSFETs 344 and 346 on rapidly and discharges node 355 and φ3, node 353, to ground rapidly before the occurrence of leading edge 944 of φ1, eliminating the possibility of any overlap between the trailing edge of φ3 and the leading edge of φ1. The leading edge of φ3 is controlled by the timing control device circuit 262 of FIG. 4, and is connected to node 274 designated $\overline{TCD}$, which is discharged to ground by the signal on node 272 when sensing of the worst case storage cell is complete. The discharge of node 274 is somewhat delayed from the charging up of node 272 so that the trailing edge 964 of φ2 has reached level 965 (FIG. 15) before the leading edge 984 of φ3 is initiated. When the signal on node 274 is discharged to ground, MOSFETs 340 and 350 of φ3 generator 308 in FIG. 5 are turned off. Bootstrap capacitor 336 was charged up during CLK transition 932, so that as MOSFET 330 pulled node 355 toward $V_{DD}$, bootstrap node 333 is boosted to a voltage which may be substantially higher than $V_{DD}$, and MOSFET 334 is turned on hard providing a fast rise time for φ3, node 353, causing transition 984, FIG. 15. As previously mentioned, the φ1$_{FF}$ transition 934 causes φ3 to go to ground; this is indicated if FIG. 15 by transition 962 of φ3.

Referring to FIG. 9, the operation of the circuitry which cooperates to generate φ2 is next described. The leading edge 957 of φ2 is controlled by the dummy decoder discharge circuit 252 in FIG. 4. Dummy decoder discharge circuit 252 is merely a clocked two-input NOR gate, the operation of which is well known. However, the configuration of waveform A, at node 260, is dependent on the waveforms at $A_{10}$ and $\overline{A_{10}}$ which may be connected to the outputs of the $A_{10}$ address buffer, which is similar to or identical to the address buffer shown in FIG. 3. The operation of the address buffer of FIG. 3 is similar to the operation of that described in the Hoffman et al patent previously mentioned herein.

Referring to FIG. 3, the operation of the address buffer is described to illustrate the derivation of the signals D1 and D2 applied to the dates of the dummy decoder discharge circuit 252. Initially, when φ1 is high, MOSFETs 396 and 406 are turned on, so that A, node 422, and $\overline{A}$, node 424, stay at ground until CLK undergoes transition 932. Referring to FIG. 14, it is seen that the address inputs $A_0$ - $A_{11}$ undergo a transition 854 prior to the positive edge of CLK, which in FIG. 14 is designated by numeral 868, which corresponds to transition 932 in FIG. 15. During φ1, MOSFETs 410 and 416 are on, so that nodes 426 and 428 are high. Since CLK is low, MOSFETs 412 and 418 are off. Depending on the level of the address input, which may be $A_{10}$, MOSFET 414 may be either on or off. When CLK goes high, transition 932, φ1 goes low during transition 946, as previously described. Nodes 426 and 428 are substantially boosted by bootstrap capacitors 400 and 402; due to charge sharing between the bootstrap capacitors 400 and 402; due to charge sharing between the bootstrap capacitors 400 and 402 and the capacitances associated with nodes 432 and 434, and also due to the fact that MOSFETs 412 and 418 are now on, since CLK is high at level 933, nodes 432 and 434 are charged toward $V_{DD}$. If the address input applied to the gate of MOSFET 414 is high, MOSFET 414 is on, and nodes 432 and 428 are discharged toward ground and consequently MOSFET 420 is turned off. Nodes 434 and 426, on the other hand, stay high, and node 422, output A, is charged toward $V_{DD}$ through MOSFET 432 as indicated in FIG. 15 by 954 in the $A_{10}$ or $\overline{A_{10}}$ waveform of FIG. 15. MOSFET 404 is off, so that A, node 424, stays at ground.

Conversely, if the address input applied to the gate of MOSFET 414 is low, MOSFET 414 is off, so that node 432 stays high during CLK due to the above described charge-sharing process so that MOSFET 420 is turned on and discharges nodes 434 and 426. MOSFET 394 is therefore turned off while MOSFET 404 remains on, so that $\overline{A}$, node 424, is charged to $V_{DD}$ through MOSFET 392 and node 422, A, stays at ground.

Referring back to FIG. 4, output 260 of dummy decoder discharge circuit 252 is pulled to ground in response to transition 954 of either $A_{10}$ or $\overline{A_{10}}$ (FIG. 15). The signal at node 260 controls the leading edge of φ2, which is produced at node 300 of φ2 generator 276. It should be noted that initailly φ2, node 300, is held at ground by MOSFET 298 when φ1 is high. Next, it is necessary to consider the operation of the timing control delay circuit 262 to determine the initial voltage on node 272, which is connected to MOSFETs 280, 290, and 294 of φ2 generator 276. Timing control delay circuit 262 has the gate of MOSFET 266 connected to timing bit sense line 152. Timing bit sense line 152 is connected to timing control device 146 of FIG. 1a. The geometries of MOSFETs 148 and 150 and the value of reference voltage $V_{REF}$ are designed so that timing bit sense line 152 is discharged in a time approximately equal to or related to the discharge time for the worst case storage cell in the entire RAM and is therefore a reliable indicator of when the sensing process is complete for the selected storage cell, so that φ2 is no longer needed. This signal is used by timing control delay circuit 262 and φ2 generator 276 to initiate the trailing edge 964 of φ2. Returning now to timing control delay circuit 262, it is clear that node 272 is initially near ground during φ1 until timing bit sense line 152 is discharged to ground.

The remaining clock signal to be described is $\overline{\phi 1}'$, which is generated by the $\overline{\phi 1}'$ generator 360 in FIG. 6. As mentioned previously, the $\overline{\phi 1}'$ signal is utilized in conjunction with address buffer 11 shown in FIG. 8 to select either the right or the left-hand half of the memory of FIGS. 1a – 1d. This selection requires a signal delayed sufficiently to allow complete selection of the proper rows and colums in the respective half arrays. Referring to FIG. 6, it is seen that a signal on node 376 is precharged during φ1 by MOSFET 368. After CLK undergoes transition 932, FIG. 15, one of the lines $A_3$ or $\overline{A_3}$, which are initially set to ground during φ1, as explained previously with reference to FIG. 3, will go high, discharging node 376 to ground. Some delay will occur between CLK transition 932 and the discharge of 376 to ground during which bootstrap capacitor 374 will be charged through MOSFET 370. When node 376 is discharged, MOSFET 372, producing transition 989 of FIG. 15. The various node capacitances and MOSFET geometries are designed to produce the desired delay between CLK and $\overline{\phi 1}'$ in order to allow column and row decoding in the memory array to be completed prior to selection of the left-hand or right-hand side thereof. By the time that nodes 422 and 424 of FIG. 8 have achieved their predetermined voltage values, one being high and the other being low. For example, node 422, $A_{11}'$, may be high (i.e., at a high voltage) and $\overline{A_{11}}'$, node 424, may be at ground. Then, by virtue of MOSFETS 452 and 462, respectively, node 453 is high and node 463 goes low and therefore MOSFET 456 is turned on the MOSFET 468 is turned off. It should be noted that $A_{11}$, node 64, and $\overline{A_{11}}$, node 66, were present to ground during $\phi 1$ by MOSFETs 460 and 472, respectively, causing transition 987 in FIG. 15. Bootstrap capacitor 454 is charged up when node 422 goes positive. Then, when $\overline{\phi 1}'$ goes positive, transition 989, $A_{11}$, node 64, rises selecting the desired half-array of the RAM. $\overline{A_{11}}$, node 66, stays at ground since MOSFET 468 is off and also since MOSFET 470 is on by virtue of node 422 being high. Additional gate-to-source drive voltage is provided to MOSFET 456 by bootstrap capacitor 454 to provide a fast rise time to $A_{11}$, node 64. If address buffer 11, reference numeral 450 of FIG. 8, had been in the opposite state, then $A_{11}$ would have remained at ground and $\overline{A_{11}}$ would have been driven to a high level, and the circuit operation would have been reversed between the left and the right-hand sides of address buffer 11.

The operation of bit sense line speed-up circuit 630 in FIG. 11 is described in conjunction with the operation of speed-up turn-off circuit 601 in FIG. 10, the operation of which is described in conjunction with the description of the operation of Write/Enable buffer 674 in FIG. 12. The purpose of the speed-up circuit 630 is to decrease the access time of RAM by detecting when the selected storage cell in the memory array has begun to discharge the bit sense line, such as bit sense line 34 in FIG. 1a, and the quadrant bit sense line coupled thereto, such as BSIV, node 70, and to speed up the remainder of the discharging process.

Once the potential of one of the quadrant bit lines BSI, BSII, BSIII, BSIV, nodes 78, 72, 74 and 70, respectively, is sufficiently discharged to insure that the noise margin limits are exceeded, a speed-up circuit 630, one for each quadrant bit sense line, cuts in and rapidly completes the discharge of the particular quadrant bit sense line connected thereto to ground, greatly reducing the access time of the RAM. The great decrease in access time is due to the fact that the horizontal array bit sense lines, such as 34, 38, 42, or 46, FIGS. 1a – 1d, and the particular quadrant bit sense lines coupled thereto under certain conditions have a large amount of capacitance and the driving capability of a selected storage cell is realtively low due to its small size. Speed-up circuit 630, FIG. 11, is essentially a modified cross-coupled latch circuit.

Referring to FIG. 1a, assume initailly, for purposes of description of the operation, that bit sense line 34 and quadrant bit sense line BSIV, node 70, are precharged to $V_{DD}-V_{TH}$ during $\phi 1$ (by MOSFET 646 of FIG. 11). Also assume that during the early part of $\phi 2$, the selected memory cell 24, FIG. 1a, has discharged both horizontal array bit sense line 34 and quadrant bit sense line BSIV, node 70, by several volts. Coupling MOSFET 62, FIG. 1a, will then be on since it is selected by Y decoder/driver 50. Referring to FIG. 11, it is noted that BSIV, node 70, is connected to speed-up circuit 630. (It should be noted that herein $V_{TH}$ is the threshold voltage of the particular MOSFET under discussion). Referring to FIG. 10, it is seen that speedup turn-off circuit 601 has node 611 thereof set to ground potential during $\phi 1$, so that MOSFET 618 is off and MOSFET 616 therefore keeps node 612 at $V_{DD}-V_{TH}$, which in turn keeps MOSFET 640, FIG. 11, in the on condition, so that node 638 is at ground, and MOSFET 644 is off. Since W, node 508 of Write Enable buffer 674, FIG. 12, was set to ground during $\phi 1$ by MOSFET 686, MOSFET 612 of FIG. 10 is off. Therefore, node 611 is charged to $V_{DD}-V_{TH}$ by MOSFET 610 when CLK undergoes transition 932, FIG. 15. This turns MOSFET 618 on, which pulls node 612 to ground, which in turn turns off MOSFET 640, FIG. 11. Meanwhile, during CLK transition 932, MOSFET 632 turned on and charged up node 634, which charged up bootstrap capacitor 633 and also turned on MOSFET 636. As MOSFET 640 is turned off, the only thing then holding node 639 near ground is MOSFET 642, the gate of which is connected to BSIV, and which is designed so that when BSIV, node 70, is at a desired threshold voltage below the noise margin limit which insures that the state of the selected storage cell is being sensed, node 639 begins to rise sufficiently to start turning MOSFET 642 on, and speed-up circuit 630, which as mentioned previously is essentially a latch, regeneratively switches states, and BSIV, node 70, is rapidly discharged the rest of the way to ground and the internal sensing of the stored state in the selected storage cell is complete. If the state of the selected storage cell is such that BSIV remains at $V_{DD}-V_{TH}$ the speed-up circuit 630 does not regeneratively switch states in the manner described above.

According to the invention, signal 612 is provided in FIG. 10 so that MOSFET 640 of speed-up of circuit 630, FIG. 11, will be in an on condition during a write cycle; then MOSFET 644 will be off and the data input circuit 500, FIG. 9, will not have to overpower MOSFET 644 of each of the four speed-up circuits in the RAM in order to write a high level onto any one of the quadrant bit sense lines. Therefore, speed-up circuit 630 in FIG. 10, in conjunction with the speed-up turn-off circuit 601 in FIG. 12 and Write Enable buffer 674 in FIG. 12 accomplish the task of greatly speeding up sensing, yet permitting a fast, low power write cycle as well as a read-modify-write cycle.

Referring to FIG. 9, data input buffer 500 provides the necessary Exclusive OR type function on the data input signal applied to the RAM and the date control signal generated by the data control register of an inverting cell type RAM. The data control signal DC on node 162 is inverted by data control inverter 603 in FIG. 10, which produces $\overline{DC}$ at node 622 during CLK. During $\phi 1$ DC is precharged to $V_{DD}-V_{TH}$ so that MOSFET 624 is on and $\overline{DC}$, node 622, is near ground. Referring to Write Enable buffer 674, FIG. 12, it is seen that when $\overline{CE}$ is at ground, node 679 will be high during CLK and during $\phi 3$ W, node 508, will also be high and the RAM chip will be "enabled" or "selected." Conversely, if $\overline{CE}$, node 670, is high, W will reamin at ground during $\phi 3$.

Referring to FIG. 9, the following discussion explains how data input buffer 500 performs an Exclusive OR type of function. The inverter including MOSFETs 509, 502 and 504 produces the signal $\overline{D_{IN}}$ at node 510 during $\phi 3$ if the RAM is selected, and it dissipates very little DC power since $\phi 1$ and W are never high at the same time and also because $\phi 3$ normally has a relatively narrow pulse width. The circuit including MOSFETs 520, 518, 512 and 514 is a dynamic two-input NOR gate, so that the signal $\overline{D_{IN} + DC}$ appears at node 516. MOSFET 518 prevents node 516, which is precharged during $\phi 1$, from being discharged before $\phi 3$, since $\overline{DC}$ is precharged prior to $\phi 3$ by CLK. The circuit including MOSFETS 524, 530, 543, and 527 is a combinational logic gate which produces the signal $\overline{DC} + \overline{D_{IN}} + DC \cdot D_{IN}$ at node 543, which is the Exclusive NOR of $\overline{D_{IN}}$ and $\overline{DC}$. This signal is inverted by the inverter including MOSFETS 534, 536 and 538 so that the Exclusive OR of $\overline{D_{IN}}$ and $\overline{DC}$ is produced at node 540 during $\phi 3$ of a write cycle if the RAM chip is selected. The output buffers provide isolation of the four quadrant bit sense lines BSI, BSII, BSIII, BSIV and also provides a sufficient amount of output current drive to rapidly charge up the respective capacitances associated with the four quadrant bit sense lines.

Referring to FIG. 13, the output buffer circuit 750 in section 730 performs an Exclusive OR type function on the four quadrant complement bit sense lines $\overline{BSI}$, $\overline{BSII}$, $\overline{BSIII}$, and $\overline{BSIV}$ (nodes 639, 752, 754 and 756, respectively) and $\overline{DC}$ in essentially the same manner that data input buffer 500, FIG. 9, operates on $\overline{D_{IN}}$ and $\overline{DC}$. $\overline{W}$ generator 732, FIG. 13, produces $\overline{W}$ at node 746, which is coupled to the gates of MOSFETs 748, 750, 752 and 754 which isolate the four quadrant complement bit sense lines from the remaining portions of output buffer 750 during a write cycle. $\overline{W}$ generator circuit 732 has as an input the signal W applied at node 684 and is generated by the Write Enable buffer 674, FIG. 12. W is equal to the logical product of $\overline{CE}$ and $\phi 3$ and is equal to a logical 1 during a read cycle and a logical 0 during a write cycle. Therefore, during a write cycle, MOSFETs 736 and 744 are on and $\overline{W}$, node 746, is at ground. During a read cycle, W is near ground, so MOSFETs 736 and 744 off prior to the edge 932 of CLK. Thus, node 740 is charged to $V_{DD}$-$V_{TH}$ prior to transition 932, FIG. 15, of CLK. Bootstrap capacitor 738 substantially boosts the voltage on node 740 during transition 932 of CLK, providing a substantial amount of overdrive voltage to pull-up MOSFET 742, which charges node 746 to $V_{DD}$ volts.

As previously mentioned, there are a plurality of small parallelograms drawn across various connections in FIGS. 12 and 13, such as parallelograms 712 in FIG. 12 and 810 in FIG. 13. There are also a plurality of closely spaced pairs of parallel lines such as spaced pair 716 in FIG. 12, in FIGS. 12 and 13 drawn across various connections. These parallelograms and pairs of spaced parallel lines are drawn to indicate the connections which may be provided or omitted by means of different metal masking options on a MOS RAM chip to provide the Exclusive OR function on the chip or to provide output signals from the chip which may be processed by external Exclusive OR circuitry, such as bipolar Exclusive OR circuits, to produce the desired data output signal representative of the stored state of the selected storage cell on the MOS RAM. The parallelograms present conenctions which are solid for the option which provides on-chip Exclusive OR type output circuitry and broken connections for external Exclusive OR type circuitry. Similarly, the pairs of spaced parallel lines indicate broken connections for the option which provides on-chip Exclusive OR type output circuitry and solid connections for the option which provides external Exclusive OR type output circuitry.

The operation of the option shown in FIGS. 12 and 13 which provides on-chip (on the MOS RAM chip, that is) Exclusive OR type output circuitry can be understood by recognizing that during a read cycle, MOSFETs 748, 750, 752 and 754 are on, so that the voltages on the quadrant complement bit sense lines $\overline{BSI}$, $\overline{BSII}$, $\overline{BSIII}$, $\overline{BSIV}$ are coupled to the gates of MOSFETs 780, 782, 786, and 788, which act as the input MOSFETs of a clocked NOR gate including them and load MOSFET 744. Thus, a logical signal which appears at node 781, the output of the above-mentioned NOR gate, is represented by the Boolean expression $\overline{BSI} + \overline{BSII} + \overline{BSIII} + \overline{BSIV} + \overline{DC}$. It will be noted that the circuit including load MOSFET 796, and switching MOSFETS 792, 798 and 772, 774, 776 and 778 is a combinational logic gate which produces at its output, node 744, the signal represented by the logical expression: $\overline{BSI} + \overline{BSII} + \overline{BSIII} + \overline{BSIV} + \overline{DC} + (\overline{BSI} + \overline{BSII} + \overline{BSIII} + \overline{BSIV} \cdot \overline{DC}$
This latter expression will be recognized as the Exclusive NOR of $\overline{DC}$ and the four quadrant complement bit sense line signals.

The bootstrap load circuitry in output buffer 750 including MOSFETs 794 and 796 and bootstrap capacitor 795 is described. It should be noted that this type of bootstrap circuit is also used in FIGS. 6 and 11. The operation is essentially as follows. Referring to FIG. 13, the output node 744 is held at ground prior to rising edge 732 of CLK, FIG. 15. In output buffer circuit 750, MOSFET 792 is turned on during $\phi 1$ to accomplish this purpose. During CLK transition 932, MOSFET 794 charges up bootstrap node 797 to $V_{DD}$-$V_{TH}$ volts, thereby charging bootstrap capacitor 795. When MOSFET 792 is turned off, output node 744 starts to rise and bootstrap capacitor 795 boosts the voltage of 797 to maintain a relatively constant gate to source voltage across MOSFET 796. Node 744 therefore rise rapidly to $V_{DD}$ volts. The circuit thus provides a clocked bootstrap load device which dissipates virtually no DC power when CLK is low.

Referring to FIG. 12, it is seen that for the option in which the Exclusive OR function of output buffer 750 is utilized on the MOS RAM chip, MOSFETs 706, 708 and 710 are disconnected for a Read Enable buffer 690. Also chip enable buffer 672 is disconnected from $V_{DD}$ and $V_{SS}$. In FIG. 13, MOSFETs 764, 766, 768, 770 and 759 are disconnected from circuit operation. However, when the Exclusive OR type output circuitry is provided external to the MOS RAM chip, the above-mentioned MOSFETs are operatively connected rather than disconnected, and instead MOSFETs 700 and 704 in Read Enable buffer 690, FIG. 12, are disconnected as are the above-mentioned NOR gate and combinational logic gate of output buffer 750 is also disconnected for the external Exclusive OR function. Operation of the connected output circuitry for this option is as follows. Referring to FIG. 12, during a write cycle $\overline{DC}$ is isolated from $C_{01}$ (which is provided as an output of the MOS RAM) by MOSFET 710, which has its gate connected to $\overline{W}$, node 746, and is therefore in the off condition. During a read cycle, MOSFET 710 is on, and a signal representative of the voltage on $\overline{DC}$ is produced at node $C_{01}$. Referring to output buffer 750, during a read cycle, if one of the four quadrant complement bit sense lines $\overline{BSI}$, $\overline{BSII}$, $\overline{BSIII}$ or $\overline{BSIV}$ is high, a corresponding one of MOSFETs 764, 766, 768 or 770 will be turned on and an output current will flow through that MOSFET and MOSFET 759 and out of node $C_{02}$, which is an external connection to the MOS RAM.

What is claimed is:
1. A MOS RAM including a bit sense line speed-up of circuit, said bit sense line speed-up circuit including a first inverter circuit and a second inverter circuit, each of said inverter circuits having an output coupled, respectively, to an input of the other of said inverter circuits, said MOS RAM comprising MOS circuit means coupled to said bit sense line speed-up circuit for disabling an output MOSFET of said bit sense line speed-up circuit in response to a signal applied to said MOS RAM during a write cycle.

2. A MOS RAM including a bit sense line coupled to an array of memory cells comprising:
- a speed-up circuit including an output node coupled to said bit sense line, said speed-up circuit including a first inverter circuit and a second inverter circuit, each of said inverter circuits having an output coupled, respectively, to an input of the other of said inverter circuits;
- a MOSFET in one of said inverter circuit coupled between voltage conductor means and said output node; and
- MOSFET circuit means coupled between a gate of said MOSFET and said voltage conductor means for turning off said MOSFET in response to a signal applied to said MOSFET circuit means, said signal being derived in response to a signal applied to said MOS RAM to cause said MOS RAM to undergo a write cycle.

3. The MOS RAM as recited in claim 2 wherein said MOSFET circuit means includes a MOSFET having its source coupled to said voltage conductor and its drain connected to a gate of said MOSFET and its gate coupled to a turnoff circuit responsive to said signal applied to said MOSFET circuit means.

4. The MOS RAM as recited in claim 3 wherein said speed-up circuit includes first, second, third and fourth MOSFETs each having a source, a gate and a drain, said first MOSFET being coupled between second voltage conductor means and a second output node, said fourth MOSFET is coupled between said second output node and said voltage conductor and has its gate connected to said output node, said third MOSFET is coupled between said output node and said voltage conductor and has its gate connected to said second output node, and said fourth MOSFET is coupled bewteen said second output node and said voltage conductor and has its gate connected to said output node.

5. The MOS RAM as recited in claim 4 further including a bootstrap MOSFET and a bootstrap capacitor, said bootstrap MOSFET being coupled between a clock signal conductor and said gate of said first MOSFET having its gate coupled to said second voltage conductor, said bootstrap capacitor being coupled between said gate and source of said first MOSFET.

6. The MOS RAM as recited in claim 3 wherein said turnoff circuit includes first, second, third, fourth and fifth MOSFETs each having a gate, a source and a drain, said first MOSFET being coupled between said second voltage conductor and said gate of said MOSFET having its gate connected to said second voltage conductor, said second MOSFET being coupled between said gate of said MOSFET and said voltage conductor, said third MOSFET being coupled between said second voltage conductor and said gate of said second MOSFET having its gate coupled to said clock conductor, said fourth MOSFET being coupled between said gate of said second MOSFET and said voltage conductor, and said fifth MOSFET being coupled between said gate of said second MOSFET and said voltage conductor.

7. The MOS RAM as recited in claim 6 wherein said turnoff circuit futher includes sixth, seventh, eighth and ninth MOSFETS each having a gate, a source and a drain and further includes a second bootstrap capacitor, said sixth MOSFET having its gate coupled to a second clock signal and being coupled between the gate of said fourth MOSFET and said voltage conductor, said seventh MOSFET being coupled between a third clock conductor and said gate of said fourth MOSFET, said second bootstrap capacitor being coupled between said gate and source of said seventh MOSFET, said eighth MOSFET being coupled between said second voltage conductor and said gate of said seventh MOSFET and having its gate coupled to said clock conductor, said ninth MOSFET having its gate coupled to an enable input of said MOS RAM and being coupled between said gate of said seventh MOSFET and said voltage conductor.

\* \* \* \* \*